United States Patent
Kim et al.

(10) Patent No.: US 11,935,677 B2
(45) Date of Patent: Mar. 19, 2024

(54) MAGNETIC DEVICE

(71) Applicant: Samsung Electronics Co., Ltd., Suwon-si (KR)

(72) Inventors: Younghyun Kim, Seoul (KR); Sechung Oh, Yongin-si (KR); Naoki Hase, Hwaseong-si (KR); Heeju Shin, Seoul (KR); Junghwan Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 293 days.

(21) Appl. No.: 17/350,157

(22) Filed: Jun. 17, 2021

(65) Prior Publication Data

US 2022/0130581 A1    Apr. 28, 2022

(30) Foreign Application Priority Data

Oct. 22, 2020    (KR) ........................ 10-2020-0137476

(51) Int. Cl.
| | |
|---|---|
| H01F 10/32 | (2006.01) |
| G11C 11/16 | (2006.01) |
| H01F 1/00 | (2006.01) |
| H10B 61/00 | (2023.01) |
| H10N 50/10 | (2023.01) |
| H10N 50/80 | (2023.01) |
| H10N 50/85 | (2023.01) |

(52) U.S. Cl.
CPC ....... *H01F 10/3254* (2013.01); *H01F 1/0063* (2013.01); *H01F 10/3272* (2013.01); *H01F 10/329* (2013.01); *H10B 61/22* (2023.02); *H10N 50/10* (2023.02); *H10N 50/80* (2023.02); *G11C 11/161* (2013.01); *H10N 50/85* (2023.02)

(58) Field of Classification Search
None
See application file for complete search history.

(56) References Cited

U.S. PATENT DOCUMENTS

| | | | | |
|---|---|---|---|---|
| 7,826,181 | B2 * | 11/2010 | Tang | H10N 50/10 365/151 |
| 8,036,025 | B2 * | 10/2011 | Nagase | G11C 11/1675 365/158 |
| 8,084,835 | B2 * | 12/2011 | Ranjan | H10B 61/22 365/158 |
| 8,456,898 | B2 * | 6/2013 | Chen | B82Y 25/00 365/158 |
| 8,493,777 | B2 * | 7/2013 | Ranjan | G11C 11/1675 365/158 |
| 8,692,342 | B2 * | 4/2014 | Oh | H10N 50/80 257/E27.008 |
| 9,793,319 | B2 | 10/2017 | Gan et al. | |
| 10,283,246 | B1 | 5/2019 | Shum et al. | |
| 10,361,361 | B2 | 7/2019 | Hu et al. | |
| 10,431,275 | B2 | 10/2019 | Jung et al. | |

(Continued)

*Primary Examiner* — Kevin M Bernatz
(74) *Attorney, Agent, or Firm* — Myers Bigel, P.A.

(57) ABSTRACT

A magnetic device includes a fixed layer including a fixed pattern, a free layer, and a tunnel barrier between the fixed layer and the free layer. The fixed pattern includes a first magnetic pattern, a second magnetic pattern, and a hybrid spacer, including a nonmagnetic material layer, between the first magnetic pattern and the second magnetic pattern, the nonmagnetic material including a plurality of magnetic nanoparticles dispersed therein.

20 Claims, 19 Drawing Sheets

(56) References Cited

U.S. PATENT DOCUMENTS

| | | |
|---|---|---|
| 10,580,969 B2 | 3/2020 | Lee et al. |
| 2002/0074541 A1* | 6/2002 | Covington ............. H10N 50/10 |
| | | 257/E27.005 |
| 2005/0254287 A1* | 11/2005 | Valet ...................... H10N 50/10 |
| | | 365/158 |
| 2009/0244960 A1* | 10/2009 | Saito ....................... G11C 11/15 |
| | | 365/158 |
| 2010/0032737 A1* | 2/2010 | Seol ........................ G11C 11/14 |
| | | 257/295 |
| 2010/0240152 A1* | 9/2010 | Wang ...................... G11C 11/15 |
| | | 257/E21.001 |
| 2016/0087194 A1 | 3/2016 | Itoh et al. |
| 2020/0052192 A1 | 2/2020 | Ma et al. |

\* cited by examiner

MAGNETIC DEVICE

CROSS-REFERENCE TO RELATED APPLICATION

This application is based on and claims priority under 35 U.S.C. § 119 to Korean Patent Application No. 10-2020-0137476, filed on Oct. 22, 2020, in the Korean Intellectual Property Office, the disclosure of which is incorporated by reference herein in its entirety.

BACKGROUND

Embodiments of the inventive concept relate to a magnetic device, and, more particularly, to a magnetic device including a magnetic layer having perpendicular magnetic anisotropy (PMA).

Much research is being done on electrical devices that make use of a magnetic resistance characteristic of a magnetic tunnel junction (MTJ). Particularly, as an MTJ cell of a highly-integrated magnetic random access memory (MRAM) device is miniaturized, spin transfer torque-magnetoresistive random access memory (STT-MRAM), which stores information on the basis of a physical phenomenon called spin transfer torque (STT) where magnetization inversion is induced by directly applying a current to an MTJ cell, is attracting much attention. In highly-integrated STT-MRAM, increases in a magnitude of an exchange magnetic field (Hex) may need to increase to secure an operation margin.

SUMMARY

The inventive concept provides a magnetic device, which increases a magnitude of an exchange magnetic field (Hex) to secure an operation margin and exhibits generally desirable heat-resistant characteristics, thereby maintaining perpendicular magnetic anisotropy (PMA) with improved stability despite relatively high heat.

According to an aspect of the inventive concept, there is provided a magnetic device including a fixed layer including a fixed pattern, a free layer, and a tunnel barrier between the fixed layer and the free layer, wherein the fixed pattern includes a first magnetic pattern, a second magnetic pattern, and a hybrid spacer, including a nonmagnetic material layer, disposed between the first magnetic pattern and the second magnetic pattern, the nonmagnetic material layer including a plurality of magnetic nanoparticles dispersed therein.

According to another aspect of the inventive concept, there is provided a magnetic device including a fixed layer, a free layer, and a tunnel barrier disposed between the fixed layer and the free layer, wherein the fixed layer includes a first fixed pattern, a second fixed pattern between the first fixed pattern and the tunnel barrier, an exchange coupling pattern between the first fixed pattern and the second fixed pattern, and wherein the second fixed pattern includes a first magnetic pattern adjacent to the exchange coupling pattern, a second magnetic pattern adjacent to the tunnel barrier, and a hybrid spacer, including a nonmagnetic material layer, between the first magnetic pattern and the second magnetic pattern, the nonmagnetic layer including a plurality of magnetic nanoparticles dispersed therein.

According to another aspect of the inventive concept, there is provided a magnetic device including a first electrode and a second electrode on a substrate and a magnetic tunnel junction (MTJ) structure between the first electrode and the second electrode, the MJT structure including a first fixed pattern, an exchange coupling pattern, a second fixed pattern, a tunnel barrier, and a free layer, which are sequentially stacked, wherein the second fixed pattern includes a first magnetic pattern adjacent to the exchange coupling pattern, a second magnetic pattern adjacent to the tunnel barrier, and a hybrid spacer, including a nonmagnetic material layer, between the first magnetic pattern and the second magnetic pattern, the nonmagnetic material layer including a plurality of magnetic nanoparticles dispersed therein.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
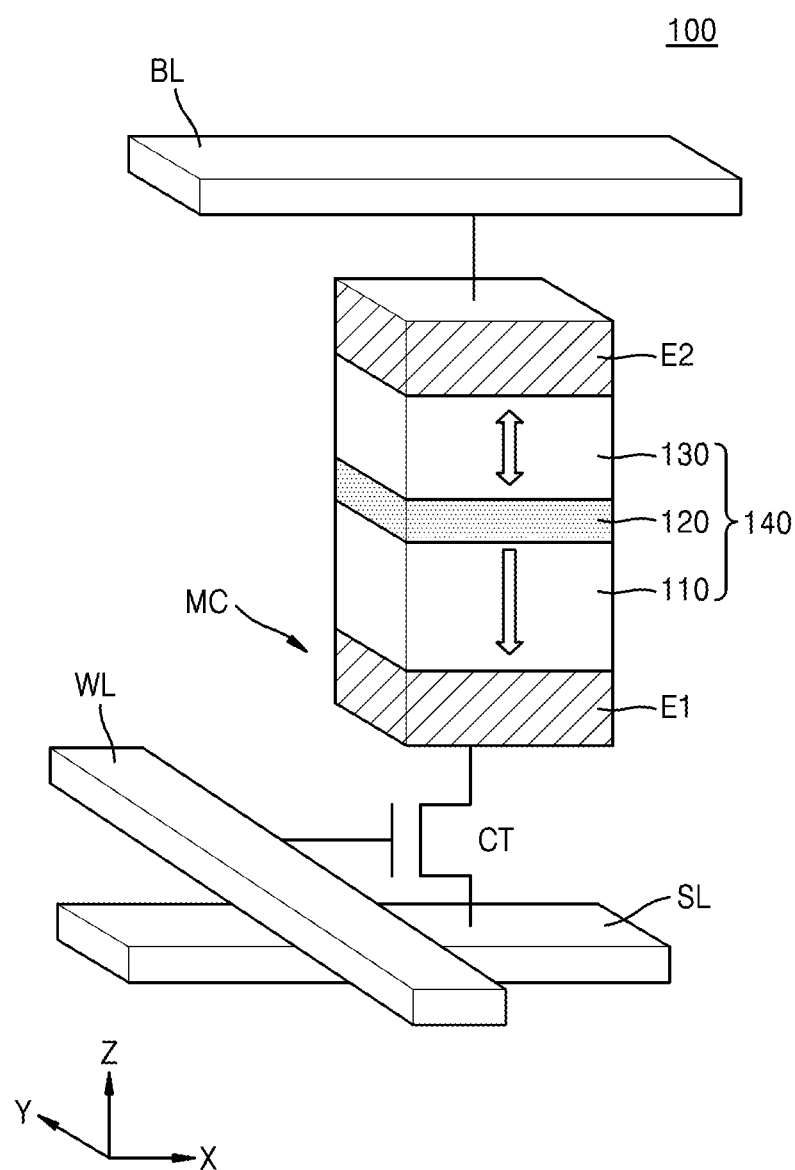
FIG. 1 is a diagram illustrating a schematic configuration of a magnetic device according to some embodiments of the inventive concept.

FIG. 1 is a diagram illustrating a schematic configuration of a magnetic device 100 according to some embodiments. In FIG. 1, the magnetic device 100 including a spin transfer torque-magnetoresistive random access memory (STT-MRAM) component is illustrated.

The magnetic device 100 may include a memory cell MC. The memory cell MC may include a first electrode E1 and a second electrode E2 spaced apart from each other in a vertical direction (a Z direction), a magnetic tunnel junction (MTJ) structure 140 disposed between the first electrode E1 and the second electrode E2, and a cell transistor CT connected to the MTJ structure 140. A gate of the cell transistor CT may be connected to a word line WL, one electrode of the cell transistor CT may be connected to a bit line BL through the MTJ structure 140, and another electrode of the cell transistor CT may be connected to a source line SL.

The MTJ structure 140 may include a fixed layer 110, a tunnel barrier 120, and a free layer 130, which are sequentially arranged in the vertical direction (the Z direction). The tunnel barrier 120 may be disposed between the fixed layer 110 and the free layer 130. The fixed layer 110 may have a magnetization easy axis in the vertical direction (the Z direction), and a magnetization direction thereof may be fixed. The free layer 130 may have a magnetization easy axis in the vertical direction (the Z direction), and a magnetization direction thereof may be variable depending on conditions. The arrangement of the fixed layer 110 and the free layer 130 is not limited to the illustration of FIG. 1, and a position of the fixed layer 110 and a position of the free layer 130 may be changed therebetween.

A resistance value of the MTJ structure 140 may vary depending on the magnetization direction of the free layer 130. When the magnetization direction of the free layer 130 is parallel to the magnetization direction of the fixed layer 110, the MTJ structure 140 may have a low resistance value and may store a data '0' value or state. When the magnetization direction of the free layer 130 is antiparallel to the magnetization direction of the fixed layer 110, the MTJ structure 140 may have a high resistance value and may store a data '1' value or state.

A unidirectional arrow illustrated in the fixed layer 110 may denote that the fixed layer 110 has fixed magnetization, and a bidirectional arrow illustrated in the free layer 130 may denote that the free layer 130 is magnetized to be parallel or antiparallel to the magnetization direction of the fixed layer 110. In the MTJ structure 140, the magnetization direction of the free layer 130 may be changed by controlling a direction of a tunneling current having spin torque.

In the magnetic device 100 illustrated in FIG. 1, for a write operation of the STT-MRAM, the cell transistor CT may be turned on by applying a logic high voltage to the word line WL, and a write current may be applied between the bit line BL and the source line SL. At this time, the magnetization direction of the free layer 130 may be determined based on a direction of the write current. In the MTJ structure 140, the magnetization direction of the free layer 130 may be changed by spin transfer torque.

In the magnetic device 100 illustrated in FIG. 1, for a read operation of the STT-MRAM, the cell transistor CT may be turned on by applying a logic high voltage to the word line WL, and data stored in the MTJ structure 140 may be determined by applying a read current in a direction from the bit line BL to the source line SL. At this time, because a level of the read current is much lower than that of the write current, the magnetization direction of the free layer 130 may not be changed by the read current.

Figure 2:
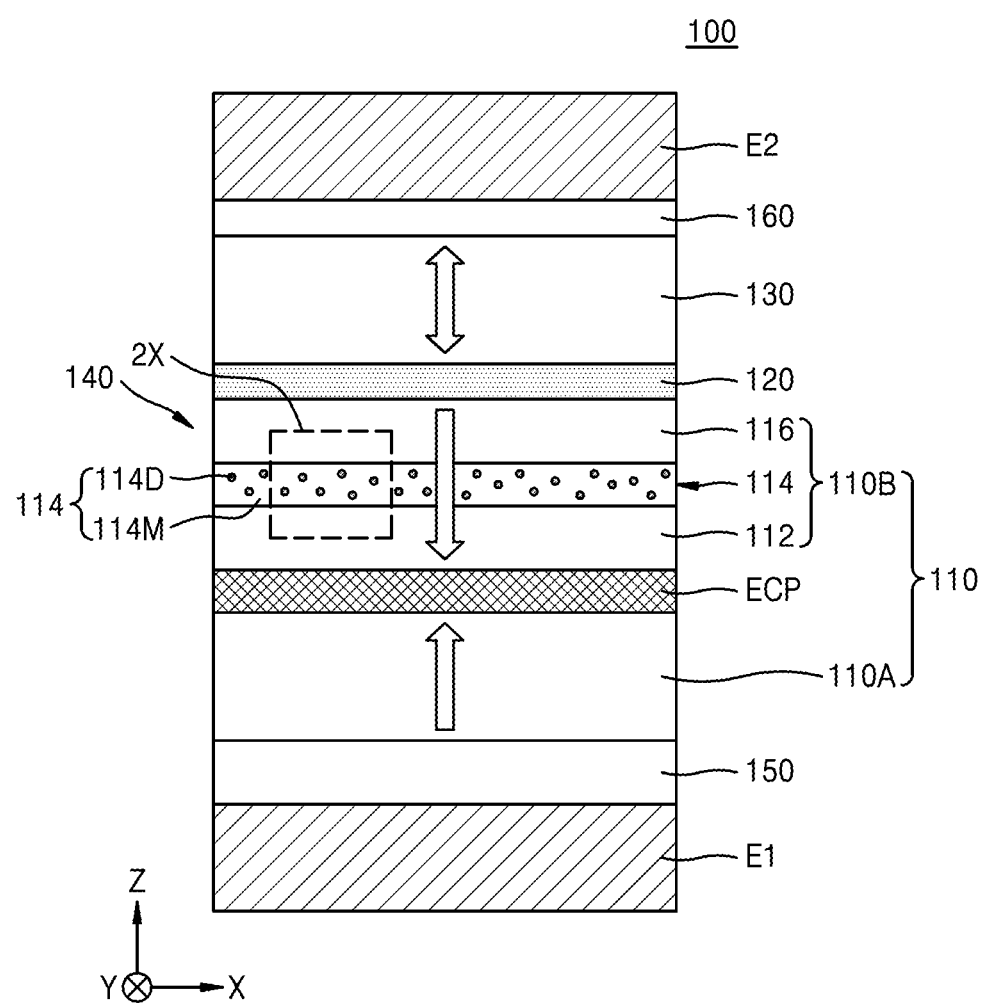
FIG. 2 is a cross-sectional view that illustrates a magnetic tunnel junction (MTJ) structure of the magnetic device illustrated in FIG. 1.

FIG. 2 is a cross-sectional view that illustrates the MTJ structure 140 of the magnetic device 100 illustrated in FIG. 1.

Referring to FIG. 2, an MTJ structure 140 of a magnetic device 100 may include a fixed layer 110, a free layer 130, and a tunnel barrier 120 disposed between the fixed layer 110 and the free layer 130.

The fixed layer 110 may include a first fixed pattern 110A, an exchange coupling pattern ECP, and a second fixed pattern 110B, which are sequentially stacked in a vertical direction (a Z direction). The exchange coupling pattern ECP may be disposed between the first fixed pattern 110A and the second fixed pattern 110B. The fixed layer 110 may have a synthetic anti-ferromagnetic (SAF) structure.

The exchange coupling pattern ECP may couple a magnetization direction of the first fixed pattern 110A to a magnetization direction of the second fixed pattern 110B in antiparallel. In some embodiments, the exchange coupling pattern ECP may couple the magnetization direction of the first fixed pattern 110A to the magnetization direction of the second fixed pattern 110B through Ruderman-Kittel-Kasuya-Yosida (RKKY) interaction. Therefore, magnetic fields generated based on the magnetization directions of the first fixed pattern 110A and the second fixed pattern 110B may be offset, and thus, a net magnetic field of the fixed layer 110 may be reduced or minimized and an influence of the free layer 130 on a magnetic field generated by the fixed layer 110 may be reduced or minimized. In some embodiments, the exchange coupling pattern ECP may include ruthenium (Ru), rhenium (Re), rhodium (Rh), tellurium (Te), yttrium (Y), chromium (Cr), iridium (Ir), silver (Ag), copper (Cu), or a combination thereof. For example, the exchange coupling pattern ECP may include Ru.

The second fixed pattern 110B among the first fixed pattern 110A and the second fixed pattern 110B may be disposed adjacent to the tunnel barrier 120, and the magnetization direction of the second fixed pattern 110B may correspond to a fixed magnetization direction of the fixed layer 110. That is, when the magnetization direction of the second fixed pattern 110B is parallel to the magnetization direction of the free layer 130, the MTJ structure 140 may have a relatively low resistance value. When the magnetization direction of the second fixed pattern 110B is antiparallel to the magnetization direction of the free layer 130, the MTJ structure 140 may have a relatively high resistance value.

Each of the first fixed pattern 110A and the second fixed pattern 110B may have a single-layer or multi-layer structure including a ferromagnetic material. In some embodiments, each of the first fixed pattern 110A and the second fixed pattern 110B may include an alloy including iron (Fe), nickel (Ni), and/or cobalt (Co) as a main component. For example, each of the first fixed pattern 110A and the second fixed pattern 110B may include Co, Ir, Co/Pt, (Co/Pt)n, Co/Pr, (Co/Pr)n, CoIr, (Co/Ir)n, (CoFe/Pt)n, (CoFe/Pd)n, (Co/Pd)n, (Co/Ni)n, (CoNi/Pt)n, (CoCr/Pt)n, (CoCr/Pd)n, or a combination thereof (where n is the number of stacks), but a material of each of the first fixed pattern 110A and the second fixed pattern 110B is not limited thereto.

In some embodiments, the first fixed pattern 110A may include a vertical magnetic material or a vertical magnetic structure. For example, the first fixed pattern 110A may include a (Co/Pt)n $L1_1$ lattice (where n is a natural number). When the first fixed pattern 110A includes a CoPt alloy, the CoPt alloy may be doped with boron (B).

The second fixed pattern 110B may include a first magnetic pattern 112, a hybrid spacer 114, and a second magnetic pattern 116, which are sequentially stacked in the vertical direction (the Z direction). The first magnetic pattern 112 may be disposed adjacent to the exchange coupling pattern ECP, the second magnetic pattern 116 may be disposed adjacent to the tunnel barrier 120, and the hybrid spacer 114 may be disposed between the first magnetic pattern 112 and the second magnetic pattern 116. Herein, the first magnetic pattern 112 may be referred to as an exchange-coupling enhancement magnetic pattern. The second magnetic pattern 116 may be referred to as a polarization enhancement magnetic pattern.

The first magnetic pattern 112 may reinforce RKKY interaction of the exchange coupling pattern ECP. In some embodiments, the first magnetic pattern 112 may physically contact the exchange coupling pattern ECP. The first magnetic pattern 112 may be spaced apart from the tunnel barrier 120 with the hybrid spacer 114 and the second magnetic pattern 116 therebetween.

In some embodiments, the first magnetic pattern 112 may have a hexagonal close packed (HCP) lattice structure or a face centered cubic (FCC) lattice structure, but the embodiments are not limited thereto. For example, the first magnetic pattern 112 may include Co, but the material used is not limited thereto.

The second magnetic pattern 116 may physically contact the tunnel barrier 120. The second magnetic pattern 116 may induce interfacial perpendicular magnetic anisotropy (i-PMA) at an interface between the tunnel barrier 120 and the second magnetic pattern 116. The degree of i-PMA between the second magnetic pattern 116 and the hybrid spacer 114 may be greater than the degree of i-PMA between the first magnetic pattern 112 and the hybrid spacer 114. In some embodiments, the second magnetic pattern 116 may have a body centered cubic (BCC) lattice structure, but embodiments of the second magnetic pattern 116 are not limited thereto. The second magnetic pattern 116 may include a magnetic material for obtaining a high magnetic resistance ratio in contact with the tunnel barrier 120. For example, the second magnetic pattern 116 may include at least one element selected from among Co, Fe, and/or Ni and one element selected from among boron (B), silicon (Si), zirconium (Zr), hafnium (Hf), beryllium (Be), aluminum (Al), carbon (C), molybdenum (Mo), tantalum (Ta), and/or copper (Cu). For example, the second magnetic pattern 116 may include cobalt-iron-boron (CoFeB), but embodiments are not limited thereto.

The hybrid spacer 114 may include a nonmagnetic material layer 114M and a plurality of magnetic nanoparticles 114D dispersed in the nonmagnetic material layer 114M. Herein, a nanoparticle may denote a particle where a diameter thereof is about 0.001 nm to about 2 nm.

The nonmagnetic material layer 114M may induce i-PMA at an interface between the hybrid spacer 114 and the second magnetic pattern 116. The plurality of magnetic nanoparticles 114D may provide a local magnetic path passing through the hybrid spacer 114 between the first magnetic pattern 112 and the second magnetic pattern 116.

The nonmagnetic material layer 114M included in the hybrid spacer 114 may include a nonmagnetic element, a nonmagnetic compound, or a nonmagnetic alloy. For example, the nonmagnetic material layer 114M may include tungsten (W), molybdenum (Mo), tantalum (Ta), platinum (Pt), iridium (Ir), aluminum (Al), hafnium (Hf), chromium (Cr), ruthenium (Ru), niobium (Nb), zirconium (Zr), vanadium (V), palladium (Pd), carbon (C), boron (B), oxygen (O), nitrogen (N), or a combination thereof.

The plurality of magnetic nanoparticles 114D included in the hybrid spacer 114 may be in the nonmagnetic material layer 114M in a doped state. In the hybrid spacer 114, the plurality of magnetic nanoparticles 114D may be doped at a concentration of about 1 at. % or more and less than about 50 at. % in the nonmagnetic material layer 114M. For example, in the hybrid spacer 114, the plurality of magnetic nanoparticles 114D may be doped at a concentration of about 5 at. % to about 30 at. % in the nonmagnetic material layer 114M. In some embodiments, a content of the plurality of magnetic nanoparticles 114D in the hybrid spacer 114 may be adjusted so that the hybrid spacer 114 has a nonmagnetic characteristic at room temperature. The term "room temperature" used herein may be about 20° C. to about 28° C. and may vary depending on the season.

In embodiments, the plurality of magnetic nanoparticles 114D may include a single kind of magnetic element. In other embodiments, the plurality of magnetic nanoparticles 114D may include at least two different kinds of magnetic elements. For example, the plurality of magnetic nanoparticles 114D may include Co, Fe, Ni, gadolinium (Gd), samarium (Sm), neodymium (Nd), praseodymium (Pr), or a combination thereof. For example, in the hybrid spacer 114, the nonmagnetic material layer 114M may include a Mo layer, a W layer, or a combination thereof, and the plurality of magnetic nanoparticles 114D may include a Co element, a Fe element, or a combination thereof. However, embodiments of the inventive concept are not limited thereto.

A thickness of each of the first magnetic pattern 112, the hybrid spacer 114, and the second magnetic pattern 116 may be set to an appropriate thickness for increasing an exchange magnetic field (Hex). When the exchange magnetic field increases, a current range may increase in a read/write operation of the magnetic device 100, and thus, a read/write margin may increase, thereby enhancing an efficiency of the magnetic device 100. In some embodiments, a magnitude of the exchange magnetic field may be adjusted based on a thickness of the hybrid spacer 114. Therefore, a magnitude of the exchange magnetic field may increase by adjusting a thickness of the hybrid spacer 114.

For example, a thickness (i.e., a Z-direction thickness) of the hybrid spacer 114 may be about 0.5 Å to about 20 Å (about 0.01 nm to about 2 nm), but embodiments are not limited thereto. Each of the first magnetic pattern 112 and the second magnetic pattern 116 may have a thickness (i.e., a Z-direction thickness) of about 1 Å to about 30 Å, but embodiments are not limited thereto.

In some embodiments, a relatively high exchange magnetic field of about 1,000 Oe to about 15,000 Oe may be obtained by appropriately selecting a material of the nonmagnetic material layer 114M included in the hybrid spacer 114, a material of each of the plurality of magnetic nanoparticles 114D, and a thickness of the hybrid spacer 114.

Figure 3:
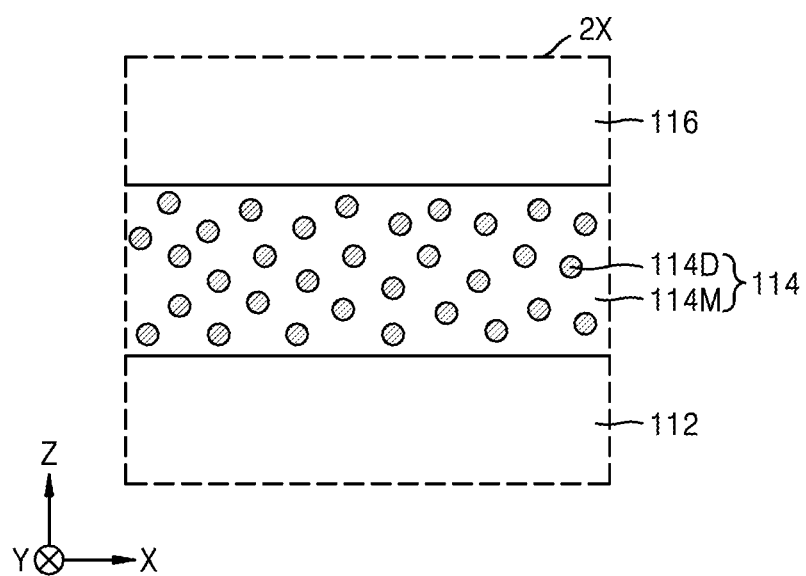
FIG. 3 is a cross-sectional view that illustrates an example structure of a hybrid spacer included in a magnetic device according to some embodiments of the inventive concept.
Figure 4:
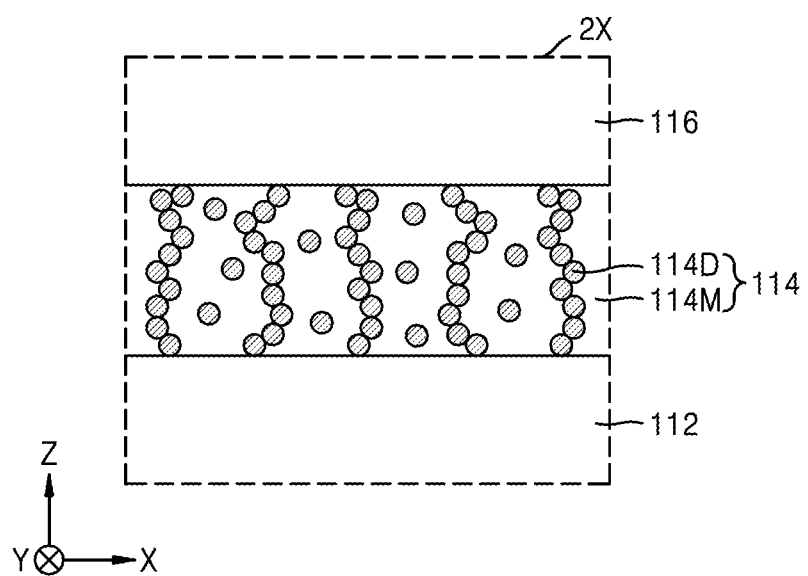
FIG. 4 is a cross-sectional view that illustrates another example structure of a hybrid spacer included in a magnetic device according to some embodiments of the inventive concept.

FIGS. 3 and 4 are diagrams that illustrate an example structure of a hybrid spacer 114, according to some embodiments of the inventive concept, and are cross-sectional views illustrating in more detail the enlargement of a region 2X of FIG. 2.

In embodiments, as illustrated in FIG. 3, the hybrid spacer 114 may include a nonmagnetic material layer 114M and a plurality of magnetic nanoparticles 114D, which are irregularly arranged and dispersed in the nonmagnetic material layer 114M. In some embodiments, a density of a plurality of magnetic nanoparticles 114D per unit dimension of the hybrid spacer 114 may be constant according to the position of the hybrid spacer 114. For example, in the nonmagnetic material layer 114M, the plurality of magnetic nanoparticles 114D may be dispersed at a constant density in a thickness direction (i.e., a vertical direction (a Z direction)) of the hybrid spacer 114.

In some embodiments, as illustrated in FIG. 4, the hybrid spacer 114 may include the nonmagnetic material layer 114M and a plurality of magnetic nanoparticles 114D, which are irregularly dispersed in the nonmagnetic material layer 114M, and at least some of the plurality of magnetic nanoparticles 114D may form at least one magnetic nanocluster 114C including an agglutination material where the at least some magnetic nanoparticles 114D agglutinate. The magnetic nanocluster 114C may provide a local magnetic path between a first magnetic pattern 112 and a second magnetic pattern 116, in the nonmagnetic material layer 114M.

Referring again to FIG. 2, a bottom surface of the hybrid spacer 114 may physically contact a top surface of the first magnetic pattern 112, and a top surface of the hybrid spacer 114 may physically contact a bottom surface of the second magnetic pattern 116.

Because the hybrid spacer 114 includes the nonmagnetic material layer 114M and the plurality of magnetic nanoparticles 114D is dispersed in the nonmagnetic material layer 114M, the nonmagnetic material layer 114M may enhance PMA of the MTJ structure 140, and the plurality of magnetic nanoparticles 114D may provide a magnetic path between the first magnetic pattern 112 and the second magnetic pattern 116, thereby increasing a magnitude of an exchange magnetic field to contribute to secure an operation margin.

Generally, to enhance a magnetic resistance ratio of the MTJ structure 140, the MTJ structure 140 may be subjected to a high temperature thermal treatment process. For example, in a case where the hybrid spacer 114 is omitted or a nonmagnetic spacer including only a nonmagnetic material is provided instead of the hybrid spacer 114, PMA of the second fixed pattern 110B may be degraded by the high temperature thermal treatment process. According to some embodiments, the second fixed pattern 110B of the magnetic device 100 may include the hybrid spacer 114, and the hybrid spacer 114 may include the nonmagnetic material layer 114M and the plurality of magnetic nanoparticles 114D dispersed in the nonmagnetic material layer 114M. Therefore, in the magnetic device 100, a magnitude of an exchange magnetic field may increase and, thus, an operation margin may be enhanced, and moreover, a heat-resistant characteristic thereof may be improved, which may maintain the PMA stability despite relatively high heat. Also, the hybrid spacer 114 may act as a diffusion barrier, which reduced or prevents elements of the first fixed pattern 110A from being diffused toward the second magnetic pattern 116 when performing the high temperature heat treatment process. Accordingly, the hybrid spacer 114 may contribute to the reliability of the MTJ structure 140.

In some embodiments, in the MTJ structure 140, the degree of i-PMA between the second magnetic pattern 116 and the hybrid spacer 114 may be greater than the degree of i-PMA between the first magnetic pattern 112 and the hybrid spacer 114.

In some embodiments, at least one of the hybrid spacer 114 and the second magnetic pattern 116 may have a lattice structure, which differs from that of the first fixed pattern 110A. In some embodiments, the first fixed pattern 110A, the exchange coupling pattern ECP, and the first magnetic pattern may have the same lattice structure as each other. For example, the first fixed pattern 110A, the exchange coupling pattern ECP, and the first magnetic pattern may have an HCP structure, but embodiments of the inventive concept are not limited thereto.

Referring to FIGS. 1 and 2, the tunnel barrier 120 may include oxide, Ti nitride, or V nitride of one material selected from among Mg, Ti, Al, MgZn, and MgB, or a combination thereof. For example, the tunnel barrier 120 may include oxide magnesium (MgO), oxide aluminum (AlO), and/or oxide magnesium aluminum (MgAlO). The tunnel barrier 120 may have an FCC lattice structure. The tunnel barrier 120 may have a thickness of about 5 Å to about 15 Å, but embodiments are not limited thereto.

The free layer 130 may physically contact the tunnel barrier 120. The free layer 130 may include a magnetic material for inducing i-PMA at an interface between the tunnel barrier 120 and the free layer 130. In some embodiments, the free layer 130 may include an Fe layer, a CoFeB layer, a CoFeNiB layer, or a combination thereof.

As illustrated in FIG. 2, a seed pattern 150 may be disposed between the first electrode E1 and the first fixed pattern 110A. The seed pattern 150 may physically contact a top surface of the first electrode E1 and may physically contact a bottom surface of the first fixed pattern 110A. In some embodiments, the seed pattern 150 may include a conductive material having the same lattice structure as that of the first fixed pattern 110A. For example, the seed pattern 150 may have an HCP lattice structure. For example, the seed pattern 150 may include Ru, Pt, and/or Pd.

The second fixed pattern 110B, including the first magnetic pattern 112, the hybrid spacer 114, and the second magnetic pattern 116, may be disposed between the exchange coupling pattern ECP and the tunnel barrier 120. In the second fixed pattern 110B shown in the cross-sectional view of FIG. 2, a bottom surface of the hybrid spacer 114 may physically contact a top surface of the first magnetic pattern 112, and a top surface of the hybrid spacer 114 may physically contact a bottom surface of the second magnetic pattern 116.

As illustrated in FIG. 2, a capping pattern 160 may be disposed between the free layer 130 and the second electrode E2. The capping pattern 160 may physically contact a top surface of the free layer 130. Also, i-PMA may be induced at an interface between the free layer 130 and the capping pattern 160.

The capping pattern 160 may include Ta, Al, Cu, Au, Ti, TaN, TiN, or a combination thereof. In some embodiments, the capping pattern 160 may be omitted.

The second electrode E2 may be on and at least partially cover a top surface of the capping pattern 160. Each of the first electrode E1 and the second electrode E2 may include metal, conductive metal nitride, doped polysilicon, or a combination thereof. For example, each of the first electrode E1 and the second electrode E2 may include Ta, Ru, Ti, Pt, W, TiN, TaN, Al, Co, Ni, Cu, doped polysilicon, or a combination thereof.

In the magnetic device 100 described above with reference to FIGS. 1 to 4, the second fixed pattern 110B may be provided between the exchange coupling pattern ECP and the tunnel barrier 120, and the second fixed pattern 110B may include a first magnetic pattern 112, a second magnetic pattern 116, and a hybrid spacer 114 disposed between the first magnetic pattern 112 and the second magnetic pattern 116. Because the hybrid spacer 114 includes the nonmagnetic material layer 114M and the plurality of magnetic nanoparticles 114D dispersed in the nonmagnetic material layer 114M, the nonmagnetic material layer 114M may enhance PMA of the MTJ structure 140, and the plurality of magnetic nanoparticles 114D may provide a magnetic path between the first magnetic pattern 112 and the second magnetic pattern 116. Accordingly, PMA of the MTJ structure 140 may be enhanced, and a magnitude of an exchange magnetic field may increase, thereby enhancing an operation margin.

Figure 5:
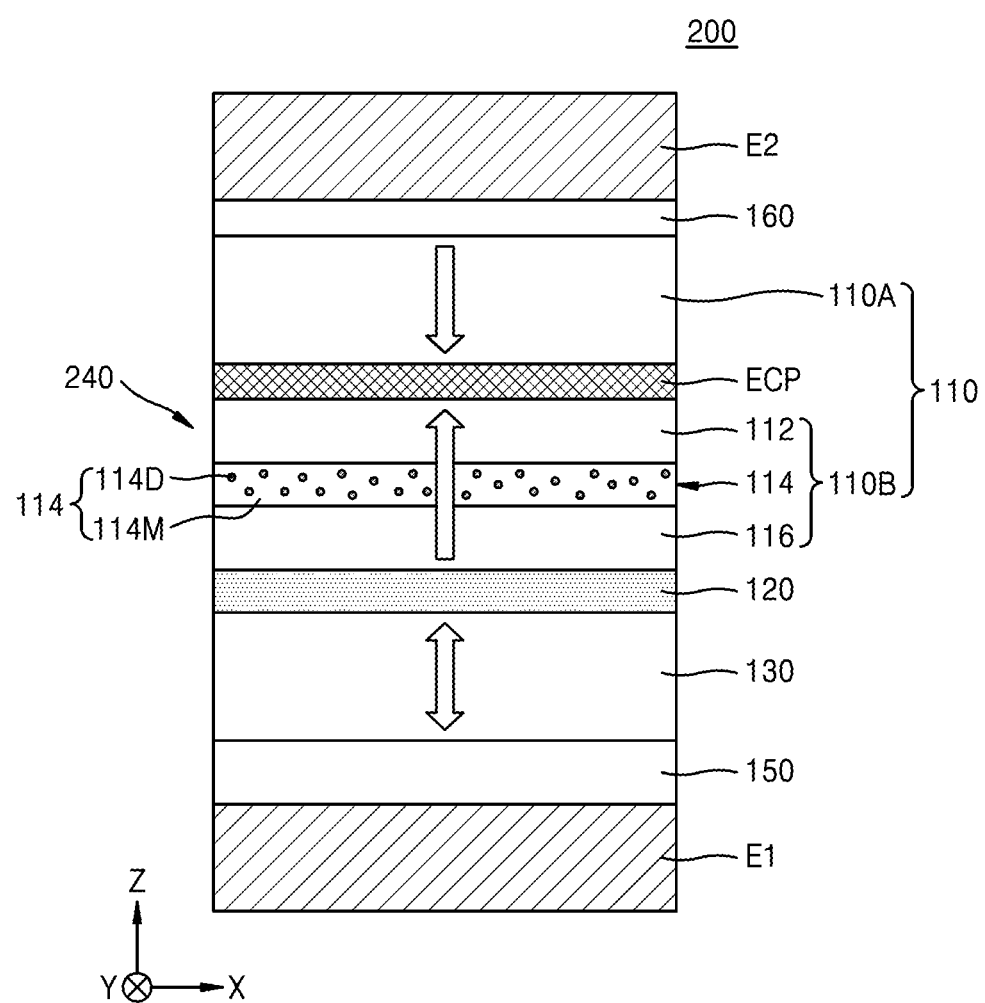
FIG. 5 is a cross-sectional view that illustrates a magnetic device according to other embodiments of the inventive concept.

FIG. 5 is a cross-sectional view that illustrates a magnetic device 200 according to other embodiments of the inventive concept. In FIG. 5, the same reference numerals as FIGS. 1 and 2 refer to like elements, and their detailed descriptions are omitted.

Referring to FIG. 5, the magnetic device 200 may have substantially the same elements as those of the magnetic device 100 described above with reference to FIGS. 1 and 2. The magnetic device 200 may include an MTJ structure 240. The MTJ structure 240 may have substantially the same elements as those of the MTJ structure 140 described above with reference to FIG. 2. A position of each of a fixed layer 110 and a free layer 130 in the MTJ structure 240 may be opposite to the MTJ structure 140 illustrated in FIG. 2.

In the MTJ structure 240 of the magnetic device 200 shown in FIG. 5, a bottom surface of the free layer 130 may physically contact a seed pattern 150, and a top surface of the free layer 130 may physically contact a tunnel barrier 120. A second fixed pattern 110B, including a first magnetic pattern 112, a hybrid spacer 114, and a second magnetic pattern 116 of the fixed layer 110, may be disposed more downward than a first fixed pattern 110A in a vertical direction (a Z direction). In the second fixed pattern 110B, a second magnetic pattern 116, a hybrid spacer 114, and a first magnetic pattern 112 may be sequentially stacked upward from a top surface of the tunnel barrier 120 in the vertical direction (the Z direction). The first fixed pattern 110A may be disposed between the exchange coupling pattern ECP and the capping pattern 160.

Figure 6:
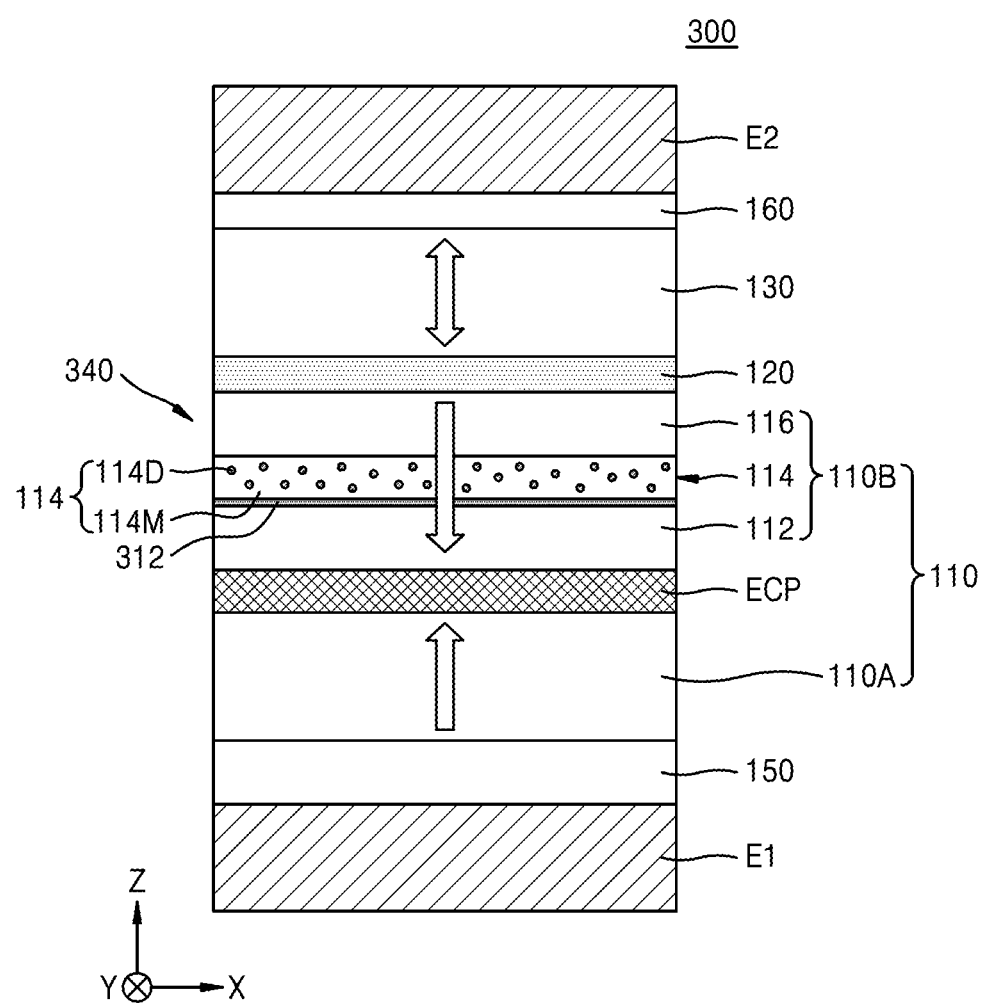
FIG. 6 is a cross-sectional view that illustrates a magnetic device according to other embodiments of the inventive concept.

FIG. 6 is a cross-sectional view that illustrates a magnetic device 300 according to other embodiments of the inventive concept. In FIG. 6, the same reference numerals as FIGS. 1 and 2 refer to like elements, and their detailed descriptions are omitted.

Referring to FIG. 6, the magnetic device 300 may have substantially the same elements as those of the magnetic device 100 described above with reference to FIGS. 1 and 2. The magnetic device 300 may include an MTJ structure 340. The MTJ structure 340 may have substantially the same elements as those of the MTJ structure 140 described above with reference to FIG. 2. The MTJ structure 340 may further include a reinforcement hybrid spacer 312 disposed between the hybrid spacer 114 and the first magnetic pattern 112.

In some embodiments, the reinforcement hybrid spacer 312 may include a reinforcement nonmagnetic material layer including W, Mo, Ta, Pt, Ir, Al, Hf, Cr, Ru, Nb, Zr, V, Pd, C, B, O, N, or a combination thereof. The reinforcement hybrid spacer 312 may not include a magnetic element.

In other embodiments, the reinforcement hybrid spacer 312 may include a reinforcement nonmagnetic material layer, including W, Mo, Ta, Pt, Ir, Al, Hf, Cr, Ru, Nb, Zr, V, Pd, C, B, O, N, or a combination thereof, and a plurality of reinforcement magnetic nanoparticles dispersed in the reinforcement nonmagnetic material layer. The plurality of reinforcement magnetic nanoparticles may include Co, Fe, Ni, Gd, Sm, Nd, Pr, or a combination thereof. When the plurality of reinforcement magnetic nanoparticles are included in the reinforcement hybrid spacer 312, the plurality of reinforcement magnetic nanoparticles may be doped at a concentration of about 1 at. % or more and less than about 50 at. % in the reinforcement nonmagnetic material. The plurality of reinforcement magnetic nanoparticles included in the reinforcement hybrid spacer 312 and the plurality of magnetic nanoparticles 114D included in the hybrid spacer 114 may include the same element, or may include different elements. A concentration of the plurality of reinforcement magnetic nanoparticles included in the reinforcement hybrid spacer 312 may be the same as or different from a concentration of the plurality of magnetic nanoparticles 114D included in the hybrid spacer 114. For example, a concentration of the plurality of reinforcement magnetic nanoparticles included in the reinforcement hybrid spacer 312 may be lower than a concentration of the plurality of magnetic nanoparticles 114D included in the hybrid spacer 114. As another example, a concentration of the plurality of reinforcement magnetic nanoparticles included in the reinforcement hybrid spacer 312 may be higher than a concentration of the plurality of magnetic nanoparticles 114D included in the hybrid spacer 114.

The reinforcement hybrid spacer 312 may reinforce a function of the hybrid spacer 114. In the MTJ structure 340, the reinforcement hybrid spacer 312 may be disposed between the hybrid spacer 114 and the first magnetic pattern 112, and thus, PMA of the MTJ structure 340 may be more enhanced or a magnitude of an exchange magnetic field may be increased. Particularly, when the reinforcement hybrid spacer 312 includes the reinforcement nonmagnetic material layer and the plurality of reinforcement magnetic nanoparticles dispersed in the reinforcement nonmagnetic material layer, a function of the hybrid spacer 114, which provides a magnetic path between the first magnetic pattern 112 and the second magnetic pattern 116, may be reinforced, thereby further increasing a magnitude of an exchange magnetic field.

Figure 7:
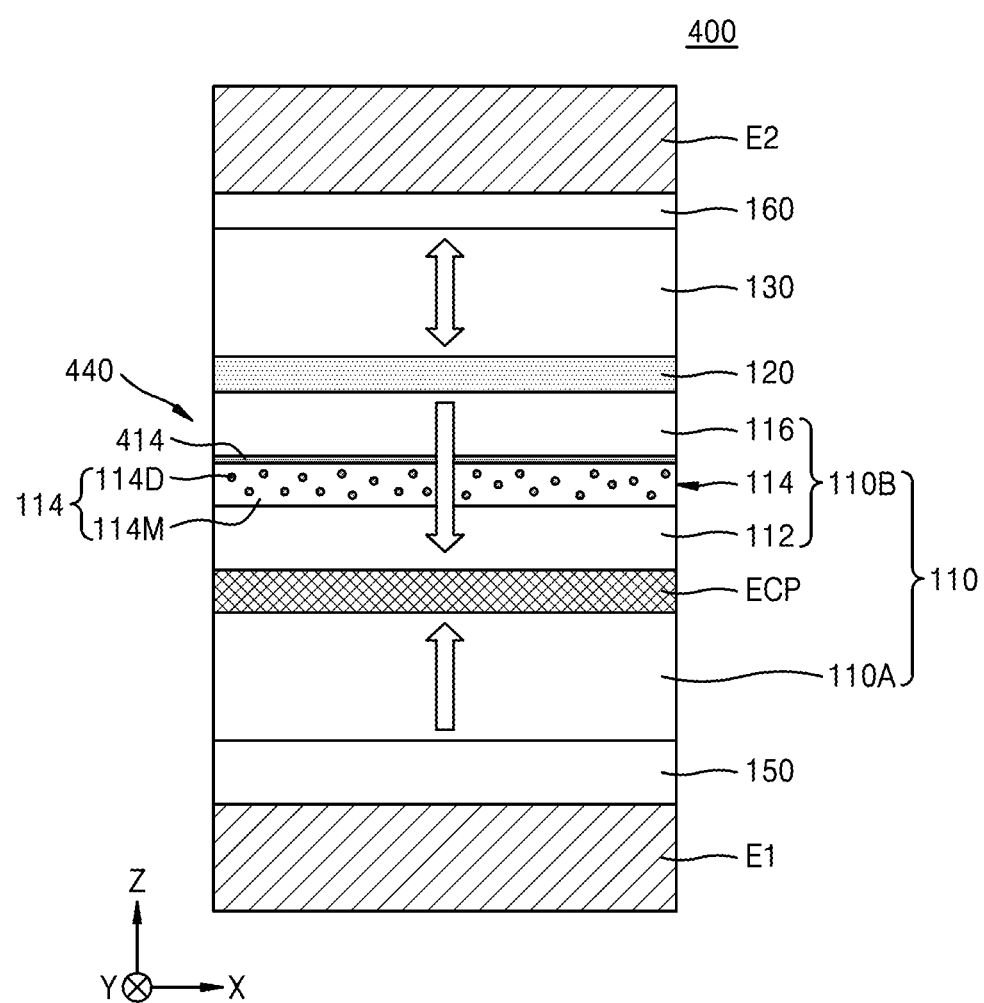
FIG. 7 is a cross-sectional view that illustrates a magnetic device according to other embodiments of the inventive concept.

FIG. 7 is a cross-sectional view that illustrates a magnetic device 400 according to other embodiments of the inventive concept. In FIG. 7, the same reference numerals as FIGS. 1 and 2 refer to like elements, and their detailed descriptions are omitted.

Referring to FIG. 7, the magnetic device 400 may have substantially the same elements as those of the magnetic device 100 described above with reference to FIGS. 1 and 2. The magnetic device 400 may include an MTJ structure 440. The MTJ structure 440 may have substantially the same elements as those of the MTJ structure 140 described above with reference to FIG. 2. Also, the MTJ structure 440 may further include a reinforcement hybrid spacer 414 disposed between a hybrid spacer 114 and a second magnetic pattern 116. The detailed configuration and effect of the reinforcement hybrid spacer 414 may be substantially the same as those of the reinforcement hybrid spacer 312 described above with reference to FIG. 6.

Figure 8:
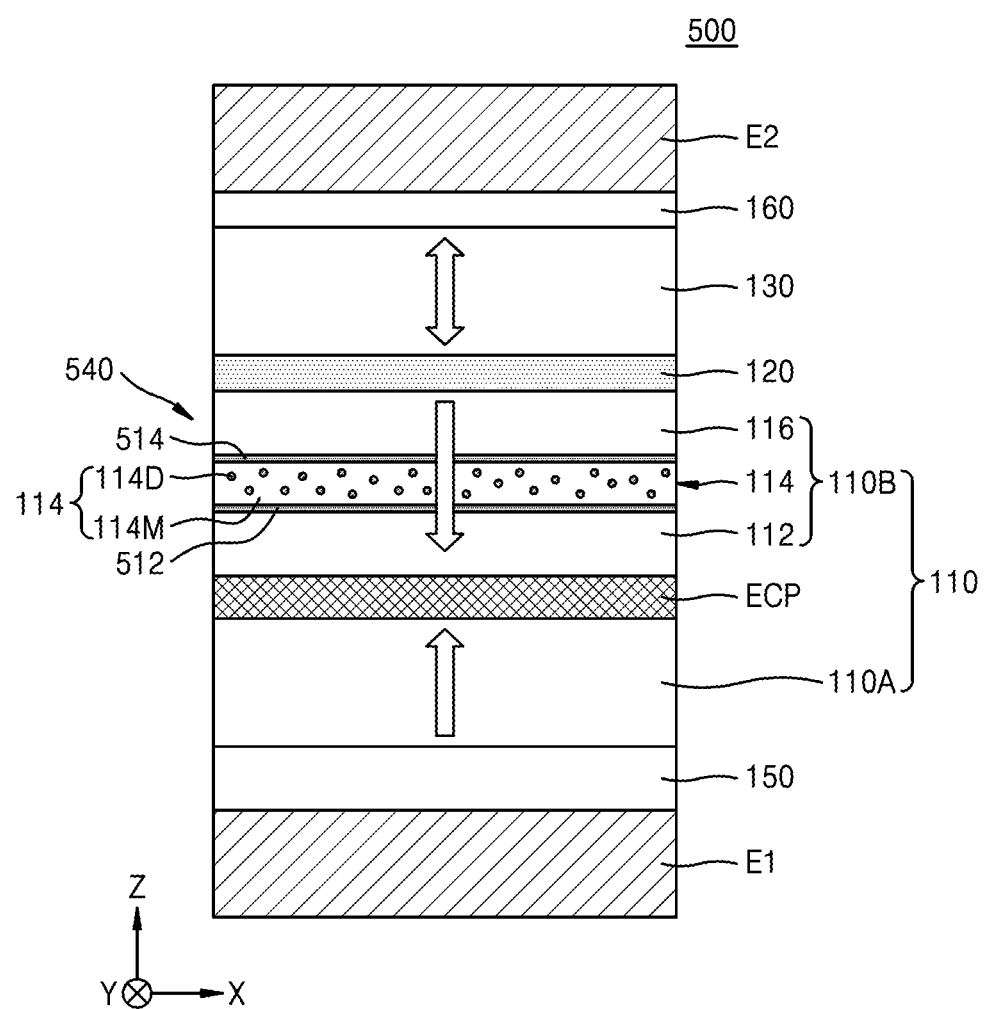
FIG. 8 is a cross-sectional view that illustrates a magnetic device according to other embodiments of the inventive concept.

FIG. 8 is a cross-sectional view that illustrates a magnetic device 500 according to other embodiments of the inventive concept. In FIG. 8, the same reference numerals as FIGS. 1 and 2 refer to like elements, and their detailed descriptions are omitted.

Referring to FIG. 8, the magnetic device 500 may have substantially the same elements as those of the magnetic device 100 described above with reference to FIGS. 1 and 2. The magnetic device 500 may include an MTJ structure 540. The MTJ structure 540 may have substantially the same elements as those of the MTJ structure 140 described above with reference to FIG. 2. Also, the MTJ structure 540 may further include a first reinforcement hybrid spacer 512 disposed between a hybrid spacer 114 and a first magnetic pattern 112 and a second reinforcement hybrid spacer 514 disposed between the hybrid spacer 114 and a second magnetic pattern 116. The detailed configuration and effect of each of the first reinforcement hybrid spacer 512 and the second reinforcement hybrid spacer 514 may be substantially the same as those of the reinforcement hybrid spacer 312 described above with reference to FIG. 6.

In some embodiments, one of the first reinforcement hybrid spacer 512 and the second reinforcement hybrid spacer 514 may not include a magnetic element and may include only a reinforcement nonmagnetic material layer having a configuration described above with reference to FIG. 6. The other of the first reinforcement hybrid spacer 512 and the second reinforcement hybrid spacer 514 may include the reinforcement nonmagnetic material layer and a plurality of reinforcement magnetic nanoparticles dispersed in the reinforcement nonmagnetic material layer. A detailed description of the plurality of reinforcement magnetic nanoparticles is as described above with reference to FIG. 6.

In FIGS. 2 to 8, a configuration where the fixed layer 110 includes the first fixed pattern 110A and the second fixed pattern 110B is illustrated, but embodiments of the inventive concept are not limited thereto. For example, the fixed layer 110 may include at least three fixed patterns including the second fixed pattern 110B, and the second fixed pattern 110B of the at least three fixed patterns may be disposed closest to the tunnel barrier 120. Each of the at least three fixed patterns may have a single-layer or multi-layer structure including a ferromagnetic material. In some embodiments, each of the at least three fixed patterns may include an alloy including Fe, Ni, or Co as a main component. For example, each of the at least three fixed patterns may include Co, Ir, Co/Pt, (Co/Pt)n, Co/Pr, (Co/Pr)n, CoIr, (Co/Ir)n, (CoFe/Pt)n, (CoFe/Pd)n, (Co/Pd)n, (Co/Ni)n, (CoNi/Pt)n, (CoCr/Pt)n, (CoCr/Pd)n, or a combination thereof (where n is the number of stacks), but a material of each of the at least three fixed patterns is not limited thereto in accordance with various embodiments of the inventive concept.

Figure 9:
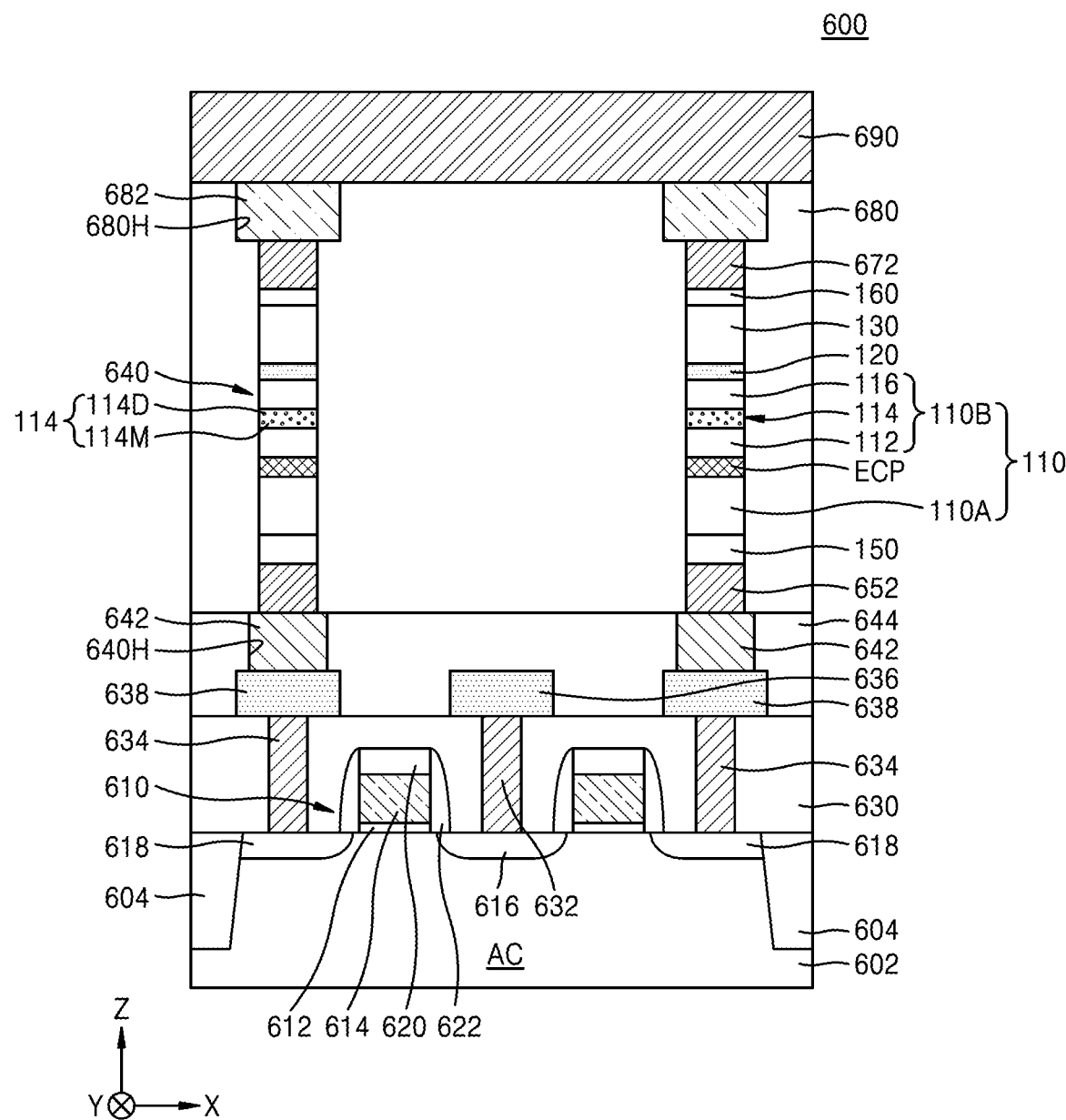
FIG. 9 is a cross-sectional view that illustrates a magnetic device according to other embodiments of the inventive concept.

FIG. 9 is a cross-sectional view that illustrates a magnetic device 600 according to other embodiments of the inventive concept. In FIG. 9, the same reference numerals as FIGS. 1 and 2 refer to like elements, and their detailed descriptions are omitted.

Referring to FIG. 9, the magnetic device 600 may include a substrate 602, including an active region AC defined by an isolation layer 604, and a plurality of transistors 610 formed in the active region AC of the substrate 602.

The substrate 602 may include a semiconductor wafer. The substrate 602 may include a semiconductor element, such as silicon (Si) or germanium (Ge), or a compound semiconductor such as SiC, GaAs, InAs, or InP. In other embodiments, the substrate 602 may have a silicon on insulator (SOI) structure. The substrate 602 may include a conductive region (for example, an impurity-doped well or an impurity-doped structure). The isolation layer 604 may have a shallow trench isolation (STI) structure.

The plurality of transistors 610 may each include a gate insulation layer 612, a gate electrode 614, a source region 616, and a drain region 618. A top surface of the gate electrode 614 may be at least partially covered in the vertical direction (a Z direction) by an insulation capping pattern 620, and both sidewalls thereof may be at least partially covered in the horizontal direction (a X direction) by an insulation spacer 622.

A first interlayer insulation layer 630 on and at least partially covering the plurality of transistors 610 may be disposed on the substrate 602, and a source line 636 and a plurality of conductive patterns 638 may be disposed on the first interlayer insulation layer 630. The source line 636 may be connected to the source region 616 of the transistor 610 through a first contact plug 632 passing through the first interlayer insulation layer 630. Each of the plurality of conductive patterns 638 may be connected to the drain region 618 of the transistor 610 through a second contact plug 634 passing through the first interlayer insulation layer 630. Each of the first contact plug 632 and the second contact plug 634 may include metal, conductive metal nitride, impurity-doped polysilicon, or a combination thereof. The source line 636 and the plurality of conductive patterns 638 may each include metal, conductive metal nitride, or a combination thereof.

The source line 636 and the plurality of conductive patterns 638 may be at least partially covered by a second interlayer insulation layer 644. A plurality of lower electrode contact plugs 642 passing through the second interlayer insulation layer 644 may be disposed on the plurality of conductive patterns 638. The plurality of lower electrode contact plugs 642 may each include metal, conductive metal nitride, impurity-doped polysilicon, or a combination thereof.

A lower electrode 652, an MTJ structure 640, and a conductive mask pattern 672 may be sequentially stacked on a top surface of each of the plurality of lower electrode contact plugs 642 in a vertical direction (a Z direction). The lower electrode 652 may include metal, conductive metal nitride, doped polysilicon, or a combination thereof. For example, the lower electrode 652 may include TiN, but embodiments are not limited thereto. The MTJ structure 640 may have the same structure of the MTJ structure 140 described above with reference to FIG. 2. The conductive mask pattern 672 may include metal or conductive metal nitride. In some embodiments, the plurality of conductive mask patterns 672 may include at least one material selected from among Ru, W, TiN, TaN, Ti, Ta, and/or a metal glass alloy. For example, the conductive mask pattern 672 may have a double-layer structure of Ru/TiN or TiN/W.

A third interlayer insulation layer 680, on and at least partially covering the lower electrode 652, the MTJ structure 640, and the conductive mask pattern 672, may be formed on the second interlayer insulation layer 644. Each of the first interlayer insulation layer 630, the second interlayer insulation layer 644, and the third interlayer insulation layer 680 may include silicon oxide, silicon nitride, or a combination thereof.

A bit line 690 may be disposed on the third interlayer insulation layer 680. A plurality of conductive mask patterns 672 connected to a plurality of MTJ structures 640 may be connected to the bit line 690 through a plurality of bit line contact plugs 682 passing through a portion of the third interlayer insulation layer 680. The plurality of bit line contact plugs 682 and the bit line 690 may each include metal, conductive metal nitride, or a combination thereof.

In FIG. 9, an example has been described where the magnetic device 600 includes the MTJ structure 540 having the same structure of the MTJ structure 140 described above with reference to FIG. 2. For example, the magnetic device 600 may have an MTJ structure selected from among the MTJ structures 240, 340, 440, and 540 described above with reference to FIGS. 5 to 8 and various MTJ structures variously modified and changed therefrom in accordance with different embodiments within the scope of the inventive concept.

FIGS. 10A to 10J are cross-sectional views that illustrate a method of manufacturing a magnetic device in process sequence, according to embodiments of the inventive concept. In the present embodiment, a method of manufacturing the magnetic device 600 illustrated in FIG. 9 will be described. In FIGS. 10A to 10J, the same reference numerals as FIGS. 1 and 2 refer to like elements, and their detailed descriptions are omitted.

Figure 10A:
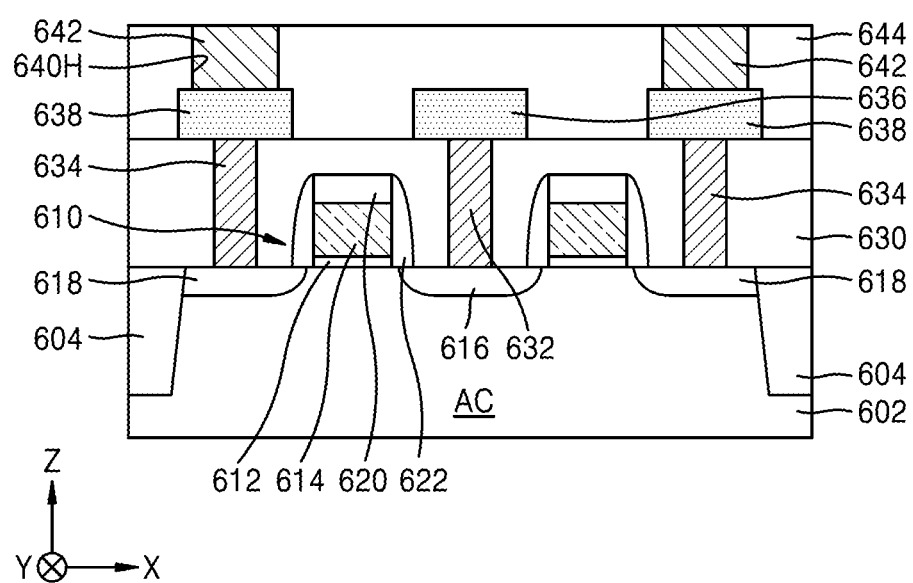
FIGS. 10A to 10J are cross-sectional views that illustrates a method of manufacturing a magnetic device in process sequence, according to some embodiments of the inventive concept.

Referring to FIG. 10A, an isolation layer 604 may be formed on a substrate 602 to define an active region AC, and a transistor 610 may be formed in the active region AC.

A first interlayer insulation layer 630 planarized to be on and at least partially cover the transistor 610 may be formed on the substrate 602, and a first contact plug 632, which passes through the first interlayer insulation layer 630 and is electrically connected to a source region 616, and a second contact plug 634 electrically connected to a drain region 618 may be formed on the substrate 602. A conductive layer may be formed on the first interlayer insulation layer 630, and then, a source line 636 and a plurality of conductive patterns 638 may be formed by patterning the conductive layer.

Subsequently, a second interlayer insulation layer 644 on and at least partially covering the source line 636 and the conductive pattern 638 may be formed on the first interlayer insulation layer 630. Subsequently, a plurality of lower electrode contact holes 640H respectively exposing top surfaces of the plurality of conductive patterns 638 may be formed by removing a portion of the second interlayer insulation layer 644 by using a photolithography process. A conductive material may be formed in the plurality of lower electrode contact holes 640H, and a plurality of lower electrode contact plugs 642 may be formed by polishing the conductive material so that a top surface of the second interlayer insulation layer 644 is exposed.

Figure 10B:
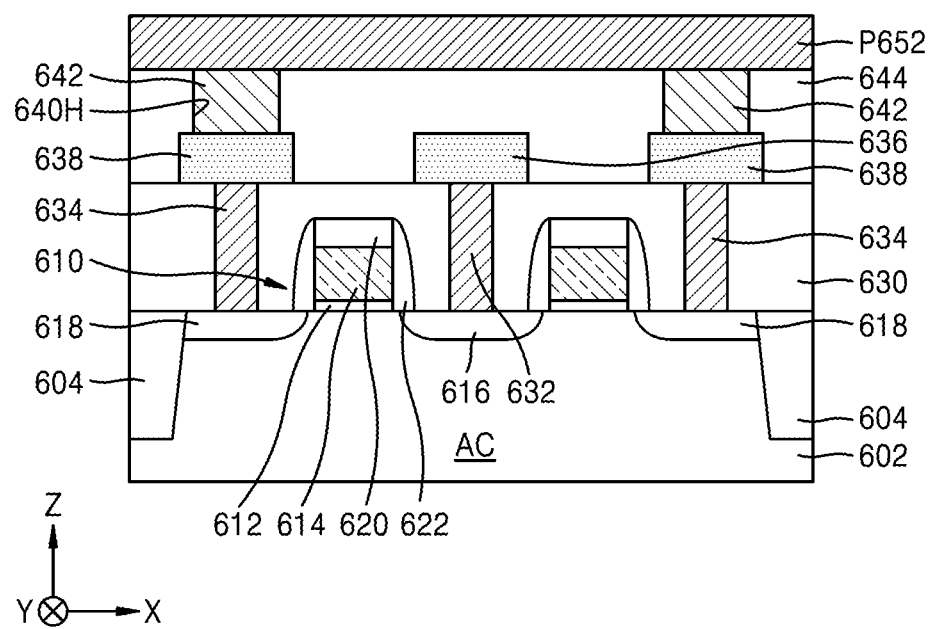

Referring to FIG. 10B, a lower electrode layer P652 may be formed on the second interlayer insulation layer 644 and the plurality of lower electrode contact plugs 642.

In some embodiments, a chemical vapor deposition (CVD) process, a physical vapor deposition (PVD) process, an atomic layer deposition (ALD) process, or a reactive pulsed laser deposition (PLD) process may be used for forming the lower electrode layer P652. A more detailed description of the lower electrode layer P652 is the same as the description of the first electrode E1 given above with reference to FIG. 2.

Figure 10C:
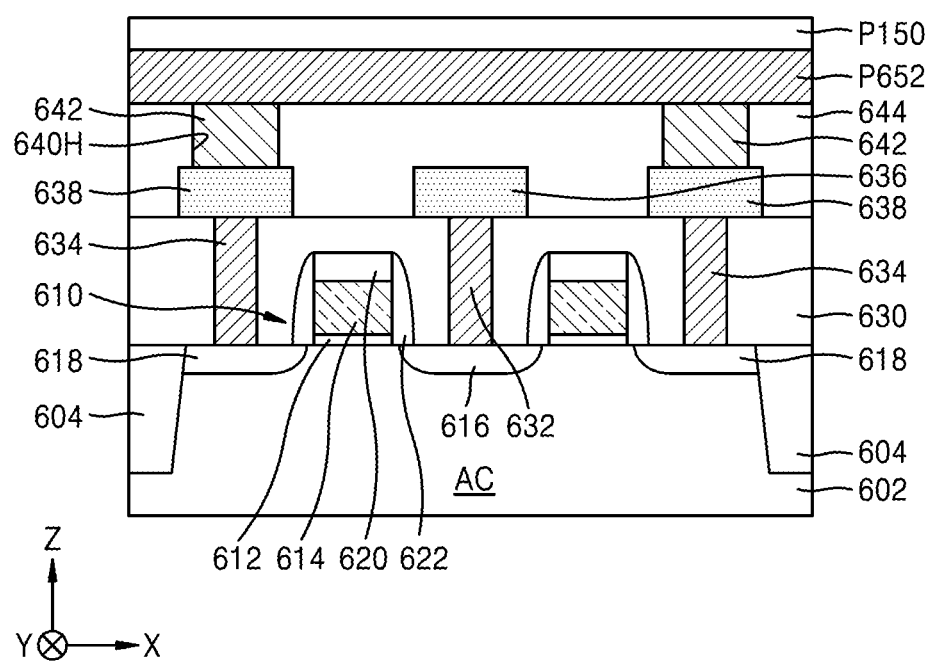

Referring to FIG. 10C, a seed layer P150 may be formed on the lower electrode layer P652. The seed layer P150 may include Ru, Pt, and/or Pd. The seed layer P150 may be formed by a CVD process, a PVD process, an ALD process, or a reactive PLD process. In embodiments, the seed layer P150 may be formed by a sputtering process.

Figure 10D:
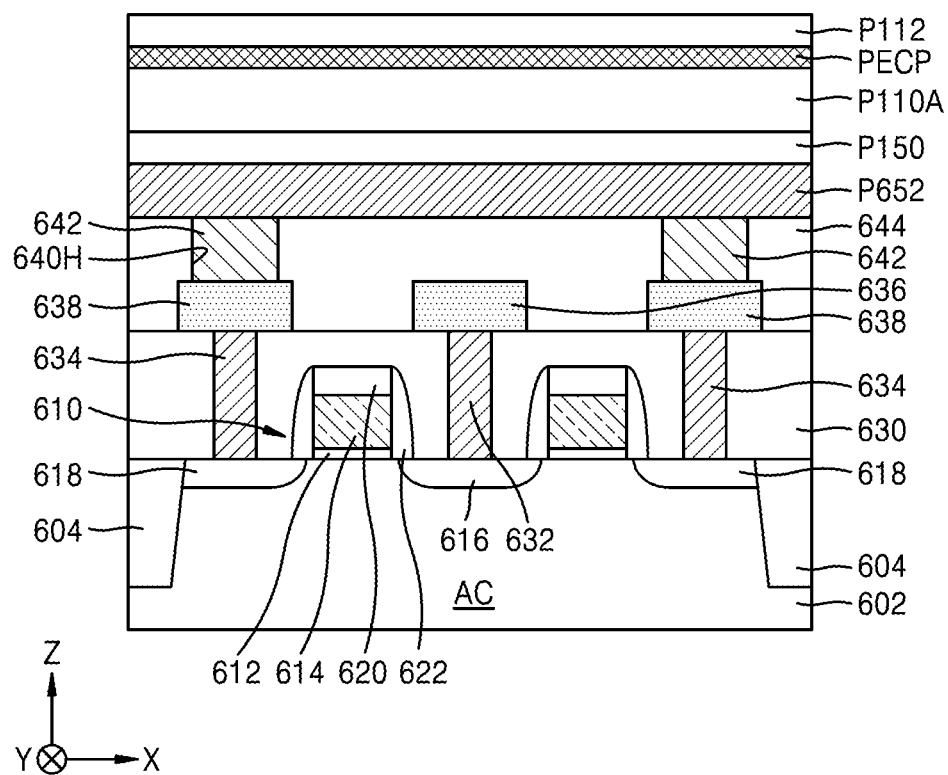

Referring to FIG. 10D, a first fixed layer P110A, an exchange coupling layer PECP, and a first magnetic layer P112 may be sequentially formed on the seed layer P150. Materials of the first fixed layer P110A, the exchange coupling layer PECP, and the first magnetic layer P112 may be the same as those of the first fixed layer 110A, the exchange coupling layer ECP, and the first magnetic layer 112, respectively, described above with reference to FIG. 2. Each of the first fixed layer P110A, the exchange coupling layer PECP, and the first magnetic layer P112 may be formed by a molecular beam epitaxy (MBE) process or a metal organic chemical vapor deposition (MOCVD) process.

Figure 10E:
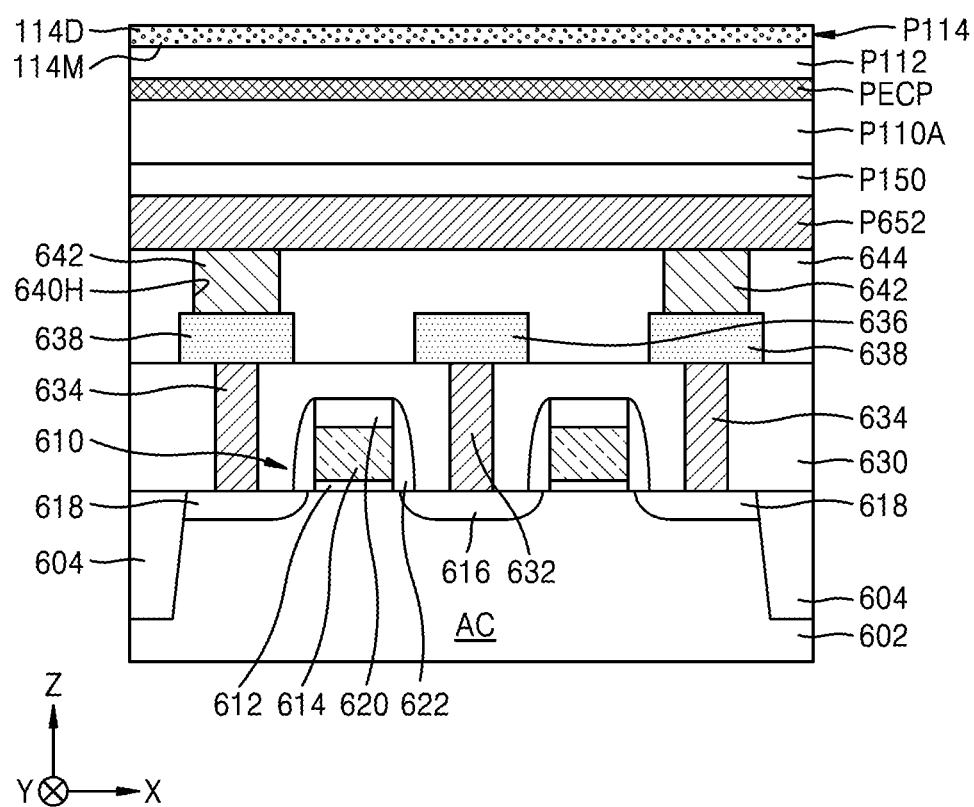

Referring to FIG. 10E, a hybrid spacer layer P114 may be formed on the first magnetic layer P112. The hybrid spacer layer P114 may be formed to include a nonmagnetic material layer 114M and a plurality of magnetic nanoparticles 114D dispersed in the nonmagnetic material layer 114M. A sputtering process may be used for forming the hybrid spacer layer P114.

In some embodiments, an alloy target, which includes elements for forming the nonmagnetic material layer 114M and elements for forming the plurality of magnetic nanoparticles 114D, may be used for forming the hybrid spacer layer 114P. A content ratio (at. %) of the elements used for forming the plurality of magnetic nanoparticles 114D in the alloy target may be determined based on a concentration of the plurality of magnetic nanoparticles 114D included in a hybrid spacer 114 (see FIG. 10J), which is to be finally formed.

In other embodiments, a co-sputtering process may be performed by using a plurality of targets, which include at least one target including the elements for forming the nonmagnetic material layer 114M to form the hybrid spacer layer P114 and at least one target including the elements for forming the plurality of magnetic nanoparticles 114D.

Figure 10F:
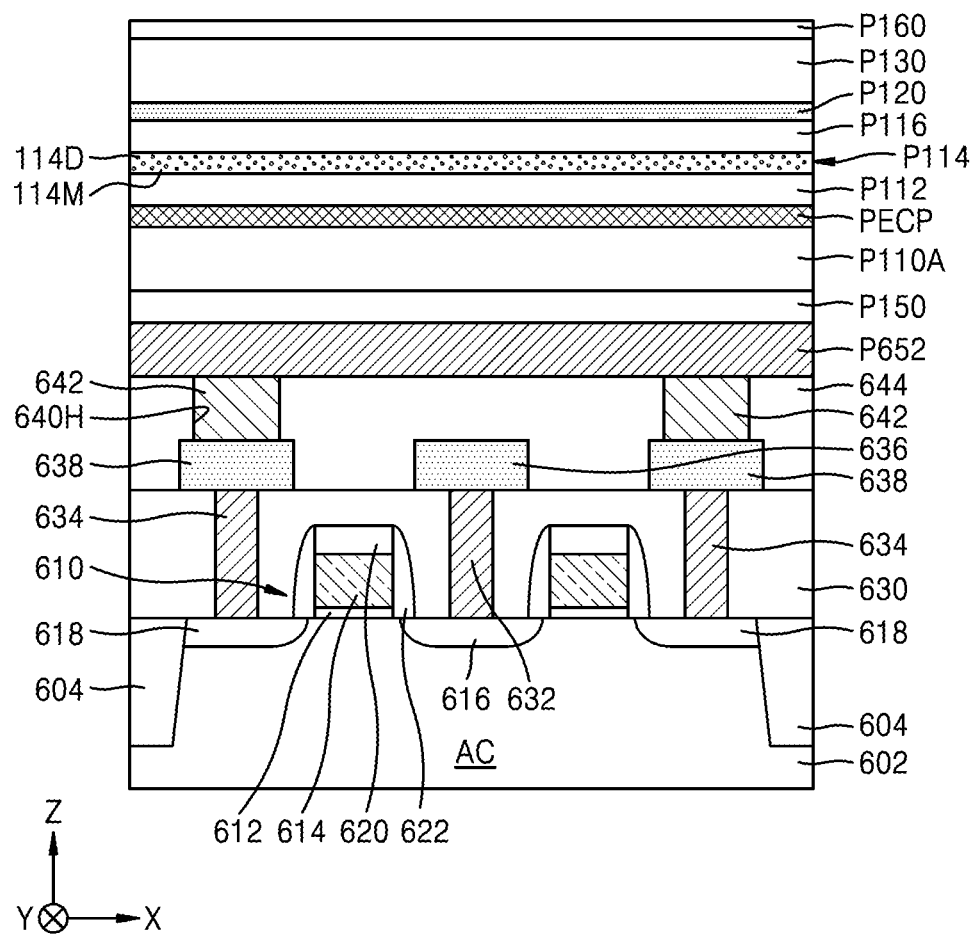

Referring to FIG. 10F, a second magnetic layer P116, a tunnel barrier layer P120, a preliminary free layer P130, and a capping layer P160 may be formed on the hybrid spacer layer P114. Materials of the second magnetic layer P116, the tunnel barrier layer P120, the preliminary free layer P130, and the capping layer P160 may be the same as those of the second magnetic layer 116, the tunnel barrier layer 120, the free layer 130, and the capping layer 160, respectively, described above with reference to FIG. 2.

Figure 10G:
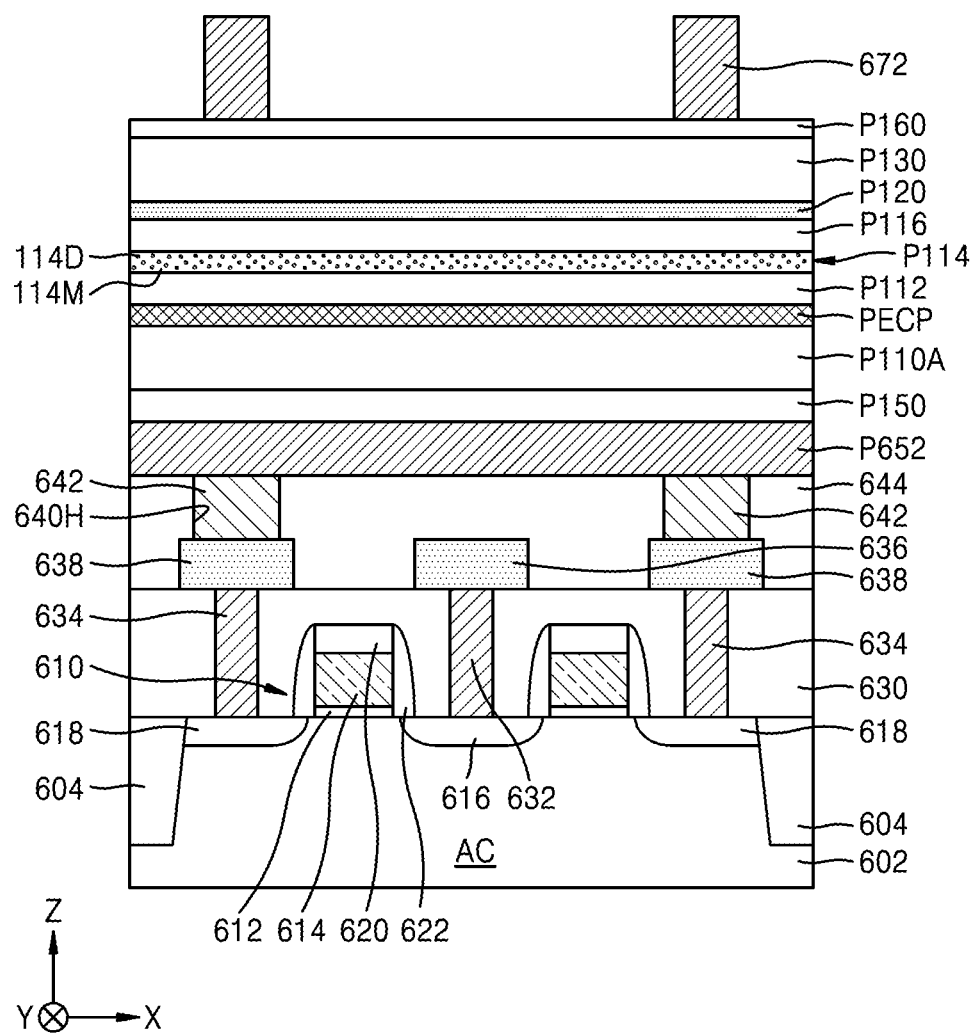

Referring to FIG. 10G, a plurality of conductive mask patterns 672 may be formed on the capping layer P160. The plurality of conductive mask patterns 672 may be formed to be placed on the same axis in the vertical direction (Z direction) on the lower electrode contact plug 642.

Figure 10H:
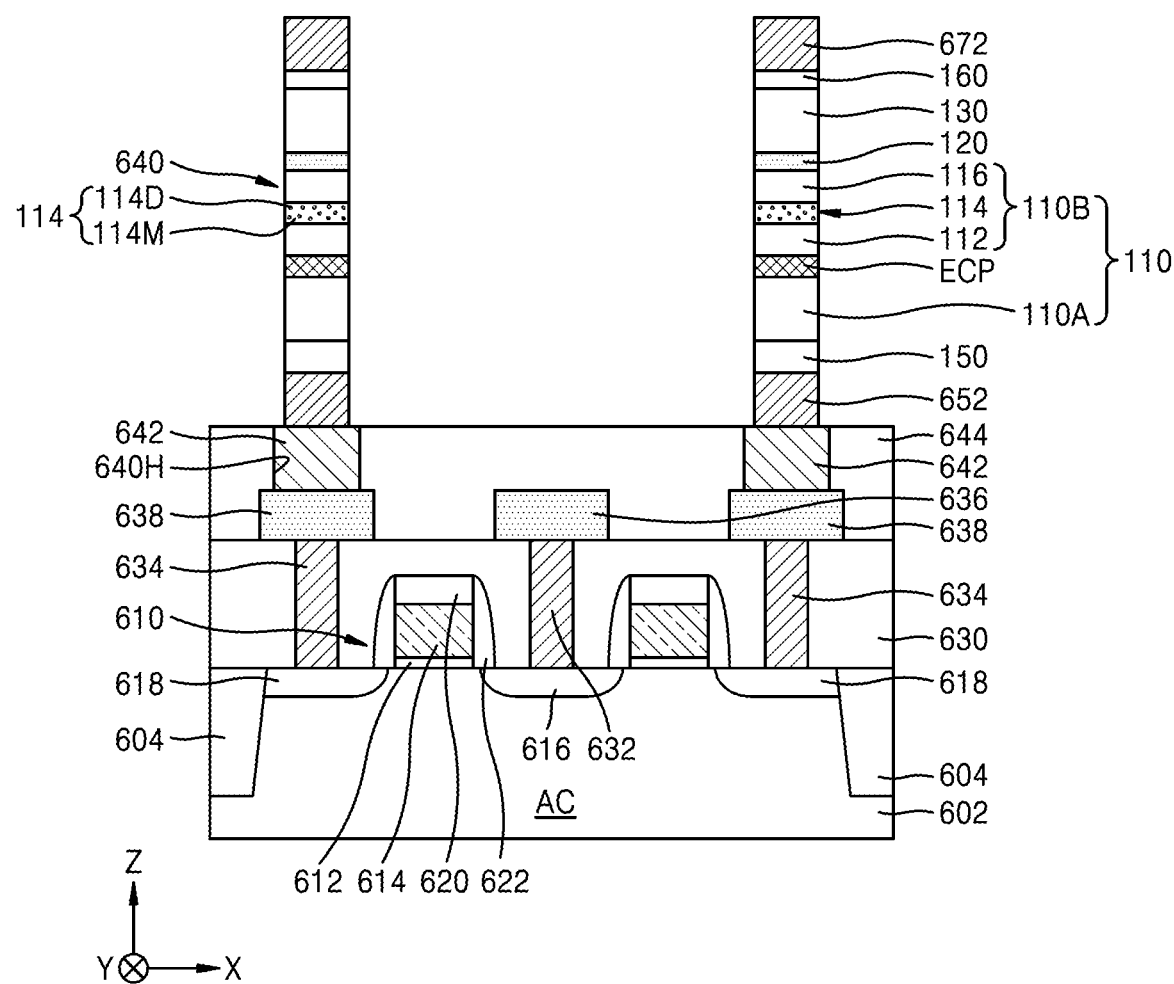

Referring to FIG. 10H, a plurality of MTJ structures 640 may be formed by etching a portion of a resultant material of FIG. 10G by using the plurality of conductive mask patterns 672 as an etch mask.

In some embodiments, by using the plurality of conductive mask patterns 672 as an etch mask to form the plurality of MTJ structures 640, a portion of the resultant material of FIG. 10G may be loaded into a plasma etch chamber, and then, an etching process may be performed. In some embodiments, the etching process may be performed by using a reactive ion etching (ME) process, an ion beam etching (IBE) process, or an Ar milling process. In some embodiments, the etching process may be performed by using plasma generated from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

While the etching process is being performed, a portion of each of the plurality of conductive mask patterns 672 may be consumed from a top surface thereof by an etch atmosphere, and thus, the plurality of conductive mask patterns 672 may have a reduced thickness. In a resultant material of FIG. 10H, remaining portions of the plurality of conductive mask patterns 672 may correspond to the second electrode E2 illustrated in FIG. 2.

Figure 10I:
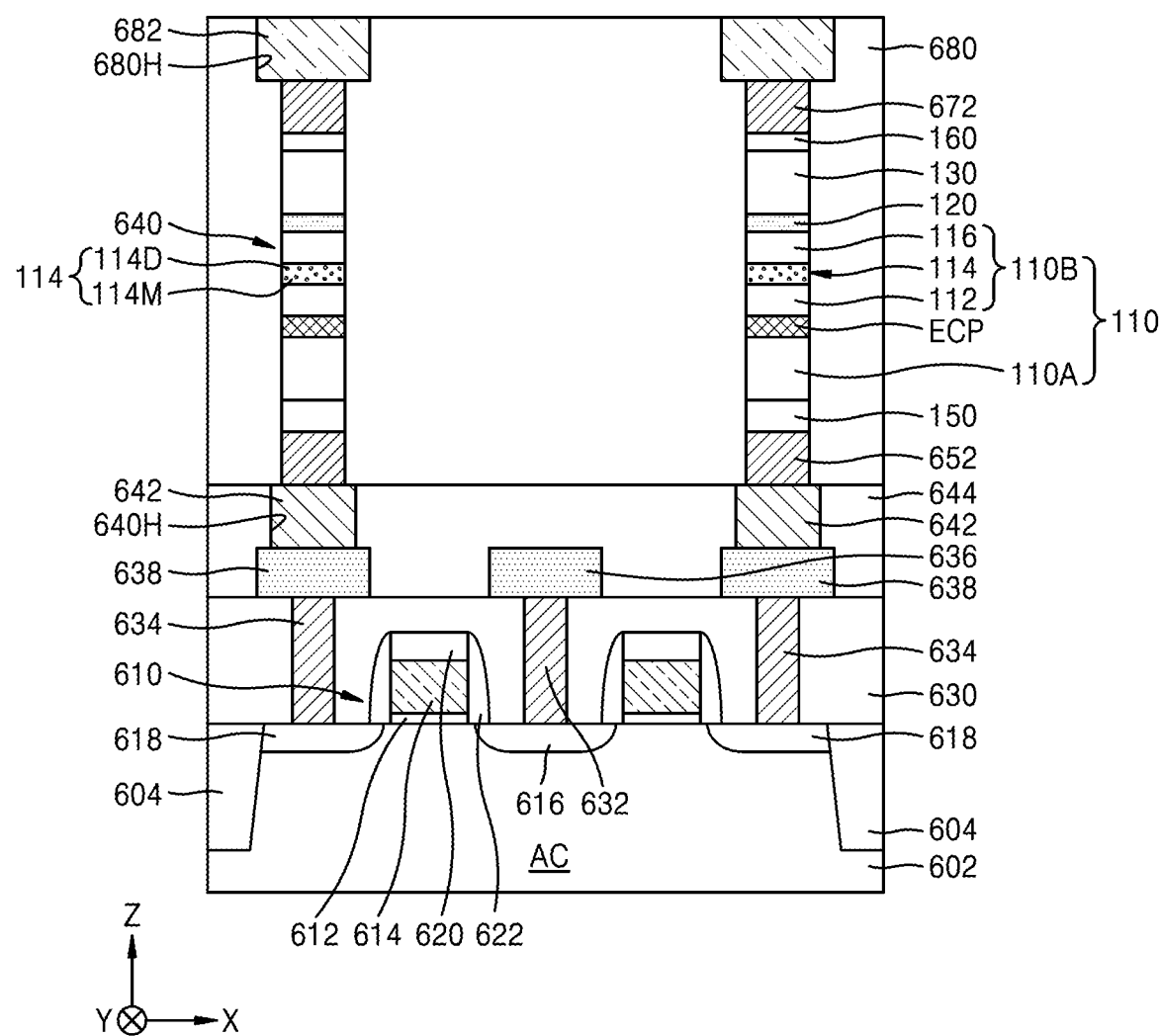

Referring to FIG. 10I, in the resultant material of FIG. 10H, a third interlayer insulation layer 680 on and at least partially covering the plurality of MTJ structures 640 and the plurality of conductive mask patterns 672 may be formed, and a plurality of bit line contact holes 680H may be formed by etching and removing a partial region of the third interlayer insulation layer 680 so that a top surface of each of the plurality of conductive mask patterns 672 is exposed. Subsequently, a conductive layer may be formed into the plurality of bit line contact holes 680H, and then, a plurality of bit line contact plugs 682 may be formed in the plurality of bit line contact holes 680H by polishing or etching back the conductive layer so that a top surface of the third interlayer insulation layer 680 is exposed.

Figure 10J:
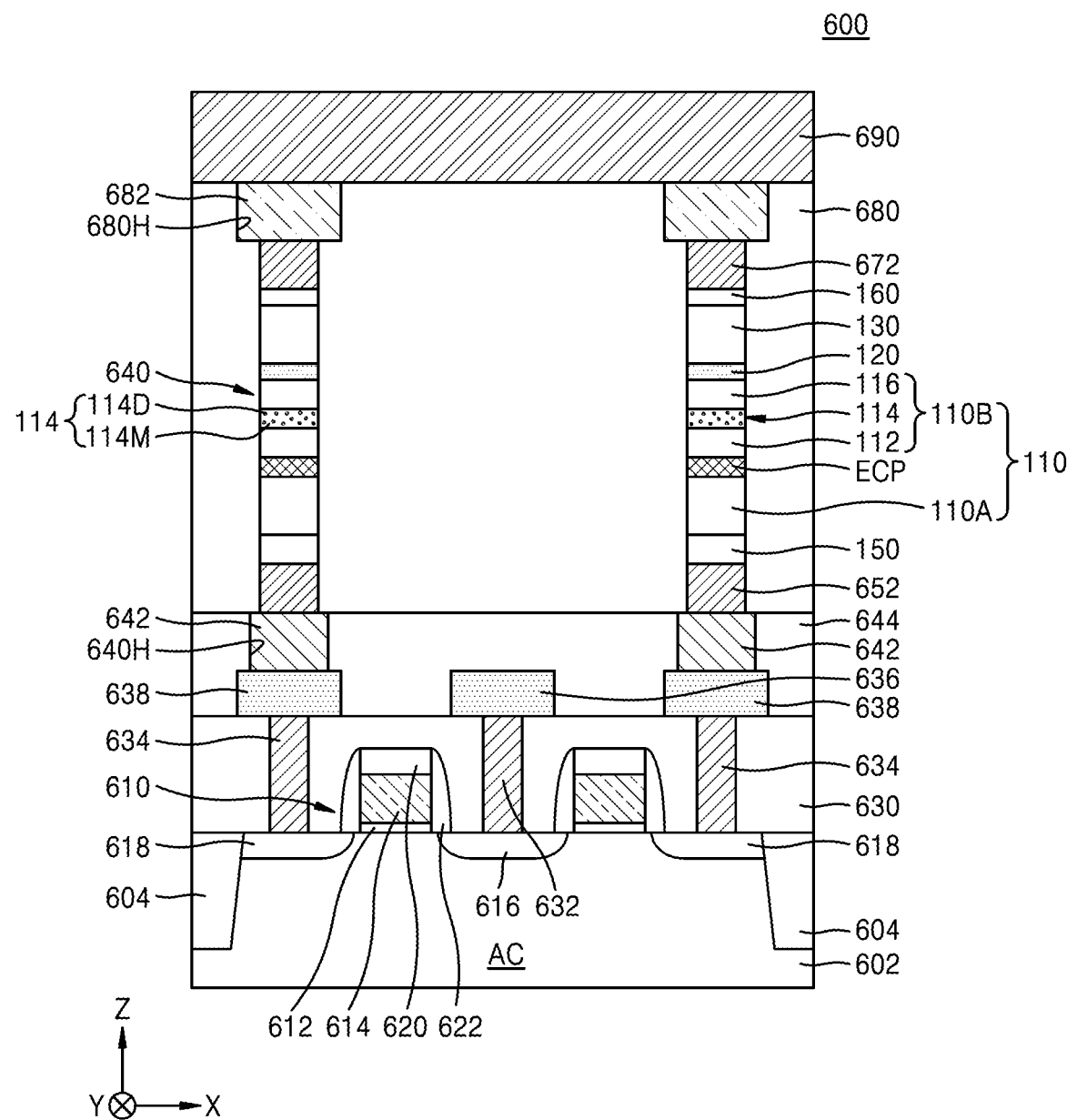

Referring to FIG. 10J, a bit line forming conductive layer may be formed on the third interlayer insulation layer 680 and the plurality of bit line contact plugs 682, and a bit line 690 electrically connected to the plurality of bit line contact plugs 682 may be formed by patterning the conductive layer, thereby manufacturing the magnetic device 600 illustrated in FIG. 9.

While the inventive concept has been particularly shown and described with reference to embodiments thereof, it will be understood that various changes in form and details may be made therein without departing from the spirit and scope of the following claims.

What is claimed is:

1. A magnetic device comprising:
 a fixed layer having perpendicular magnetic anisotropy (PMA) and including a fixed pattern, a free layer having PMA, and a tunnel barrier between the fixed layer and the free layer, wherein the fixed pattern comprises:
 a first magnetic pattern;
 a second magnetic pattern; and
 a hybrid spacer, including a nonmagnetic material layer, between the first magnetic pattern and the second magnetic pattern, the nonmagnetic material layer including a plurality of magnetic nanoparticles dispersed therein, the plurality of magnetic nanoparticles having sizes in a range from about 0.001 nm to about 2 nm.

2. The magnetic device of claim 1, wherein the nonmagnetic material layer comprises a nonmagnetic element, a nonmagnetic compound, or a nonmagnetic alloy.

3. The magnetic device of claim 1, wherein the plurality of magnetic nanoparticles are provided at a concentration of 1 at. % or more and less than 50 at. %.

4. The magnetic device of claim 1, wherein the plurality of magnetic nanoparticles are irregularly arranged and dispersed in the nonmagnetic material layer.

5. The magnetic device of claim 1, wherein the hybrid spacer comprises a magnetic nanocluster configured to provide a local magnetic path between the first magnetic pattern and the second magnetic pattern, and
 wherein the magnetic nanocluster comprises some of the plurality of magnetic nanoparticles.

6. The magnetic device of claim 1, wherein, the plurality of magnetic nanoparticles comprise a single kind of element.

7. The magnetic device of claim 1, wherein, the plurality of magnetic nanoparticles comprise at least two different kinds of elements.

8. The magnetic device of claim 1, wherein, the first magnetic pattern has a hexagonal close packed (HCP) lattice structure or a face centered cubic (FCC) lattice structure and is apart from the tunnel barrier with the hybrid spacer and the second magnetic pattern therebetween, and
 wherein the second magnetic pattern has a body centered cubic (BCC) lattice structure and physically contacts the tunnel barrier.

9. The magnetic device of claim 1, wherein the fixed layer further comprises an exchange coupling pattern, the fixed pattern being between the exchange coupling pattern and the tunnel barrier, and
 wherein the first magnetic pattern physically contacts the exchange coupling pattern, and the second magnetic pattern physically contacts the tunnel barrier.

10. The magnetic device of claim 1, wherein the fixed pattern further comprises a first reinforcement hybrid spacer between the hybrid spacer and the first magnetic pattern or a second reinforcement hybrid spacer between the hybrid spacer and the second magnetic pattern, and
 wherein each of the first reinforcement hybrid spacer and the second reinforcement hybrid spacer comprises a reinforcement nonmagnetic material layer including no magnetic element.

11. The magnetic device of claim 1, wherein the fixed pattern further comprises a first reinforcement hybrid spacer disposed between the hybrid spacer and the first magnetic pattern or a second reinforcement hybrid spacer between the hybrid spacer and the second magnetic pattern, and
 wherein each of the first reinforcement hybrid spacer and the second reinforcement hybrid spacer comprises a reinforcement nonmagnetic material layer and a plurality of reinforcement magnetic nanoparticles dispersed in the reinforcement nonmagnetic material layer.

12. The magnetic device of claim 1, wherein the fixed pattern further comprises a first reinforcement hybrid spacer between the hybrid spacer and the first magnetic pattern, and a second reinforcement hybrid spacer between the hybrid spacer and the second magnetic pattern,
 wherein a first one of the first reinforcement hybrid spacer and the second reinforcement hybrid spacer comprises a reinforcement nonmagnetic material layer including no magnetic element, and
 wherein a second one of the first reinforcement hybrid spacer and the second reinforcement hybrid spacer comprises a reinforcement nonmagnetic material layer and a plurality of reinforcement magnetic nanoparticles dispersed in the reinforcement nonmagnetic material layer.

13. The magnetic device of claim 1, wherein the hybrid spacer is nonmagnetic at room temperature.

14. A magnetic device comprising:
 a fixed layer having perpendicular magnetic anisotropy (PMA), a free layer having PMA, and a tunnel barrier disposed between the fixed layer and the free layer,
 wherein the fixed layer comprises a first fixed pattern, a second fixed pattern between the first fixed pattern and the tunnel barrier, an exchange coupling pattern between the first fixed pattern and the second fixed pattern, and
 wherein the second fixed pattern comprises:
 a first magnetic pattern adjacent to the exchange coupling pattern;
 a second magnetic pattern adjacent to the tunnel barrier; and
 a hybrid spacer, including a nonmagnetic material layer, between the first magnetic pattern and the second magnetic pattern, the nonmagnetic material layer including a plurality of magnetic nanoparticles dispersed therein, the plurality of magnetic nanoparticles having sizes in a range from about 0.001 nm to about 2 nm.

15. The magnetic device of claim 14, wherein the nonmagnetic material layer comprises tungsten (W), molybdenum (Mo), tantalum (Ta), platinum (Pt), iridium (Ir), aluminum (Al), hafnium (Hf), chromium (Cr), ruthenium (Ru), niobium (Nb), zirconium (Zr), vanadium (V), palladium (Pd), carbon (C), boron (B), oxygen (O), nitrogen (N), or a combination thereof.

16. The magnetic device of claim 14, wherein the plurality of magnetic nanoparticles comprise cobalt (Co), iron (Fe), nickel (Ni), gadolinium (Gd), samarium (Sm), neodymium (Nd), praseodymium (Pr), or a combination thereof.

17. The magnetic device of claim 14, wherein the plurality of magnetic nanoparticles in the nonmagnetic material layer are dispersed at a constant density in a thickness direction of the hybrid spacer.

18. The magnetic device of claim 14, wherein the hybrid spacer comprises at least one magnetic nanocluster configured to provide a local magnetic path between the first magnetic pattern and the second magnetic pattern, and
  wherein the at least one magnetic nanocluster comprises some of the plurality of magnetic nanoparticles.

19. A magnetic device comprising:
  a first electrode and a second electrode on a substrate; and
  a magnetic tunnel junction (MTJ) structure between the first electrode and the second electrode, the MJT structure including a first fixed pattern having perpendicular magnetic anisotropy (PMA), an exchange coupling pattern, a second fixed pattern having PMA, a tunnel barrier, and a free layer having PMA, which are sequentially stacked,
  wherein the second fixed pattern comprises:
    a first magnetic pattern adjacent to the exchange coupling pattern;
    a second magnetic pattern adjacent to the tunnel barrier; and
    a hybrid spacer, including a nonmagnetic material layer, between the first magnetic pattern and the second magnetic pattern, the nonmagnetic material layer including a plurality of magnetic nanoparticles dispersed therein, the plurality of magnetic nanoparticles having sizes in a range from about 0.001 nm to about 2 nm.

20. The magnetic device of claim 19, wherein the nonmagnetic material layer comprises a nonmagnetic element, a nonmagnetic compound, or a nonmagnetic alloy, and
  wherein a density of the plurality of magnetic nanoparticles in the nonmagnetic material layer is constant in a thickness direction of the hybrid spacer.

* * * * *